US012812994B2

(12) United States Patent
Kim et al.

(10) Patent No.: US 12,812,994 B2
(45) Date of Patent: Nov. 24, 2026

(54) IMAGE SENSOR AND METHOD OF MANUFACTURING THE SAME

(71) Applicant: SAMSUNG ELECTRONICS CO., LTD., Suwon-si (KR)

(72) Inventors: Junghyun Kim, Suwon-si (KR); Jonghoon Park, Suwon-si (KR); Yun Ki Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 392 days.

(21) Appl. No.: 18/387,933

(22) Filed: Nov. 8, 2023

(65) Prior Publication Data

US 2024/0258346 A1 Aug. 1, 2024

(30) Foreign Application Priority Data

Jan. 30, 2023 (KR) ........................ 10-2023-0011666

(51) Int. Cl.
*H10F 39/00* (2025.01)
*H10F 39/18* (2025.01)

(52) U.S. Cl.
CPC ......... *H10F 39/805* (2025.01); *H10F 39/024* (2025.01); *H10F 39/182* (2025.01); *H10F 39/8053* (2025.01); *H10F 39/8063* (2025.01); *H10F 39/807* (2025.01)

(58) Field of Classification Search
None
See application file for complete search history.

(56) References Cited

U.S. PATENT DOCUMENTS

| | | | | |
|---|---|---|---|---|
| 10,079,259 | B2 | 9/2018 | Yu et al. | |
| 10,276,620 | B2 * | 4/2019 | Chien | H10F 39/8067 |
| 10,937,821 | B2 | 3/2021 | Jung | |
| 11,245,823 | B2 | 2/2022 | Chen et al. | |
| 11,322,536 | B2 | 5/2022 | Kim et al. | |
| 12,396,281 | B2 * | 8/2025 | Kim | H10F 39/199 |

(Continued)

FOREIGN PATENT DOCUMENTS

| | | |
|---|---|---|
| KR | 10-1967835 | 4/2019 |
| KR | 10-2020-0029098 A | 3/2020 |

OTHER PUBLICATIONS

Office Action dated Sep. 16, 2026 issued in Korean Patent Application No. 10-2023-0011666.

*Primary Examiner* — Bradley Smith
(74) *Attorney, Agent, or Firm* — MORGAN, LEWIS & BOCKIUS LLP

(57) ABSTRACT

An image sensor includes: a substrate; a plurality of photodiodes disposed in the substrate; an element isolation film disposed between the plurality of photodiodes; an anti-reflection layer disposed on the plurality of photodiodes and the element isolation film; a plurality of color filters disposed on the anti-reflection layer; a fence pattern disposed between the plurality of color filters and in the anti-reflection layer; and micro lenses disposed on the plurality of color filters, wherein the fence pattern includes a first layer and a second layer that is disposed on the first layer and that includes a material different from that of the first layer, the first layer is disposed in the anti-reflection layer, and the second layer includes a first part and a second part, wherein the first part is disposed in the plurality of color filters, and wherein the second part is disposed in the anti-reflection layer.

20 Claims, 26 Drawing Sheets

(56) References Cited

U.S. PATENT DOCUMENTS

| | | | |
|---|---|---|---|
| 2015/0130007 A1 | 5/2015 | Kawamura et al. | |
| 2022/0077211 A1 | 3/2022 | Cho | |
| 2022/0165763 A1* | 5/2022 | Kim | H10F 39/807 |

* cited by examiner

I-I'

IMAGE SENSOR AND METHOD OF MANUFACTURING THE SAME

CROSS-REFERENCE TO RELATED APPLICATION

This application claims priority under 35 U.S.C. § 119 to Korean Patent Application No. 10-2023-0011666 filed in the Korean Intellectual Property Office on Jan. 30, 2023, the disclosure of which is incorporated by reference herein in its entirety.

TECHNICAL FIELD

The present inventive concept relates to an image sensor and a method of manufacturing the same.

DISCUSSION OF THE RELATED ART

A CMOS image sensor is a solid-state imaging device using a complementary metal-oxide semiconductor (CMOS). Compared to a charge-coupled device (CCD) image sensor having a high-voltage analog circuit, the CMOS image sensor may have a lower manufacturing cost and less power consumption due to its smaller size. Therefore, the CMOS image sensor may be installed in a home appliance including, for example, a portable device such as a smartphone and a digital camera.

Generally, a pixel array included in the CMOS image sensor may include a photoelectric conversion element such as a photodiode for each pixel. The photoelectric conversion element may generate an electrical signal that varies based on an amount of light incident thereto, and the CMOS image sensor may synthesize an image by processing the generated electrical signal.

To meet a demand for a high-resolution image, it is desirable for the pixel that is included in the CMOS image sensor to be relatively small in size. In accordance with an increasing demand for a smaller pixel, incident light might not be properly sensed, or noise may occur due to interference produced between the elements having an increased degree of integration.

There is an increasing demand for the CMOS image sensor to have higher image quality and additional functions despite its relatively small size.

SUMMARY

According to an embodiment of the present inventive concept, an image sensor includes: a substrate; a plurality of photodiodes disposed in the substrate; an element isolation film disposed between the plurality of photodiodes; an anti-reflection layer disposed on the plurality of photodiodes and the element isolation film; a plurality of color filters disposed on the anti-reflection layer; a fence pattern disposed between the plurality of color filters and in the anti-reflection layer; and micro lenses disposed on the plurality of color filters, wherein the fence pattern includes a first layer and a second layer that is disposed on the first layer and that includes a material different from that of the first layer, the first layer is disposed in the anti-reflection layer, and the second layer includes a first part and a second part, wherein the first part is disposed in the plurality of color filters, and wherein the second part is disposed in the anti-reflection layer.

According to an embodiment of the present inventive concept, an image sensor includes: a substrate having a pixel group including a plurality of pixels; a plurality of photodiodes disposed in the substrate and respectively corresponding to the plurality of pixels; an element isolation film disposed between the plurality of photodiodes; an anti-reflection layer disposed on the plurality of photodiodes and the element isolation film; a plurality of color filters disposed on the anti-reflection layer; a fence pattern disposed between the plurality of color filters and in the anti-reflection layer; and micro lenses disposed on the plurality of color filters, wherein the fence pattern includes a first part, a second part, and a third part, wherein the first part is disposed in the color filter, wherein the second part is disposed in the anti-reflection layer, and wherein the third part is disposed in the anti-reflection layer and is disposed between the first part and the second part, the second part is disposed between upper and lower surfaces of the anti-reflection layer, the first part and the third part include a same material as each other, and the second part includes a material different from those of the first part and the third part.

According to an embodiment of the present inventive concept, a method of manufacturing an image sensor includes: forming a plurality of photodiodes in a substrate; forming an element isolation film between the plurality of photodiodes; forming a first anti-reflection layer on the plurality of photodiodes and the element isolation film; forming a second anti-reflection layer on the first anti-reflection layer; forming a first trench by patterning the second anti-reflection layer; forming a first layer of a fence pattern by providing a conductive material in the first trench; forming a third anti-reflection layer on the second anti-reflection layer; forming a second trench exposing the first layer by patterning the third anti-reflection layer; and forming a second layer of the fence pattern in the second trench, wherein the second layer protrudes beyond an upper surface of the third anti-reflection layer, and wherein the second layer of the fence pattern includes a material different from those of the first layer and the third anti-reflection layer.

DETAILED DESCRIPTION OF THE EMBODIMENTS

Figure 1:
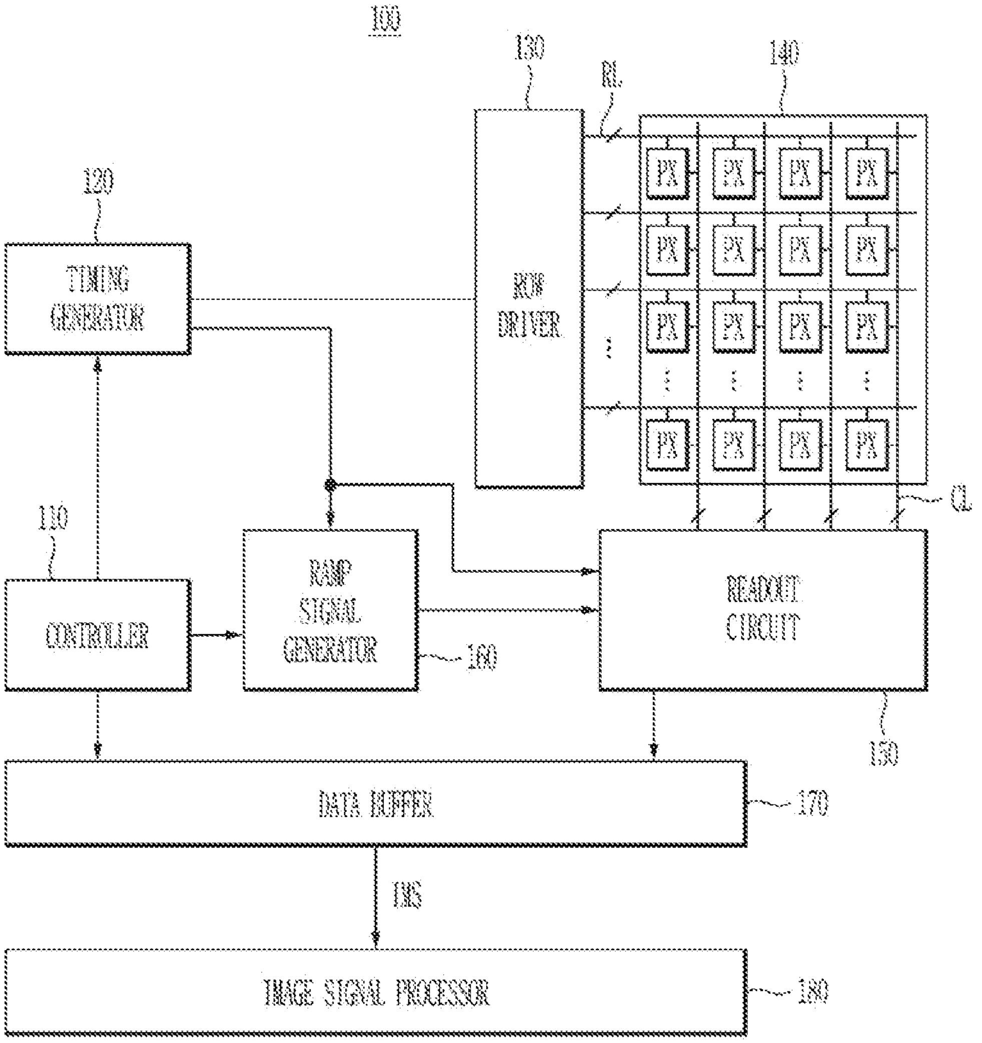
FIG. 1 is a block diagram schematically showing an image sensor according to an embodiment of the present inventive concept.

Hereinafter, embodiments of the present inventive concept are described in detail with reference to the accompanying drawings. However, the present inventive concept may be modified in various different forms, and is not limited to the embodiments provided herein.

The same or similar components are denoted by the same reference numeral throughout the specification and drawings.

In the drawings, various thicknesses, lengths, and angles are shown and while the arrangement shown does indeed represent an embodiment of the present invention, it is to be understood that modifications of the various thicknesses, lengths, and angles may be possible within the spirit and scope of the present inventive concept and the present invention is not necessarily limited to the particular thicknesses, lengths, and angles shown.

In addition, when an element such as a layer, a film, a region or a substrate is referred to as being "on" or "above" another element, it may be "directly on" another element or may have a third element interposed therebetween. On the contrary, when an element is referred to as being "directly on" another element, there is no third element interposed between the element and the other element. In addition, when referred to as being "on" or "above" a reference element, an element may be positioned on or below the reference element, and might not necessarily be "on" or "above" the reference element toward an opposite direction of gravity.

Further, throughout the specification, the word "on a plane" may indicate a case where a target is viewed from the top unless indicated otherwise, and the word "on the cross section" may indicate a case where a cross section of a target taken along a vertical direction is viewed from the side.

FIG. 1 is a block diagram schematically showing an image sensor according to an embodiment of the present inventive concept.

Referring to FIG. 1, an image sensor 100 according to an embodiment of the present inventive concept may include a pixel array 140 and a logic circuit controlling the pixel array 140.

The logic circuit is a circuit for controlling the pixel array 140, and may include, for example, a controller 110, a timing generator 120, a row driver 130, a readout circuit 150, a ramp signal generator 160, and a data buffer 170.

In addition, the image sensor 100 may further include an image signal processor 180, and in some embodiments of the present inventive concept, the image signal processor 180 may be disposed outside the image sensor 100. The image sensor 100 may generate an image signal by converting light received from the outside into an electrical signal. The image signal may be provided to the image signal processor 180.

The image sensor 100 may be mounted in an electronic device having an image or light sensing function. For example, the image sensor 100 may be mounted in the electronic device such as a camera, a smartphone, a wearable device, an internet of things (IoT) device, a home appliance, a tablet personal computer (PC), a navigation device, a drone, or an advanced driver assistance system (ADAS). In addition, the image sensor 100 may be mounted in the electronic device provided as a component in a vehicle, furniture, manufacturing facility, a door, various measuring devices, or the like.

The pixel array 140 may include a plurality of pixels PX, a plurality of row lines RL and a plurality of column lines CL, respectively connected to the plurality of pixels PX.

In an embodiment of the present invention, each pixel PX may include at least one photoelectric conversion element. The photoelectric conversion element may detect light incident thereto and convert the incident light into the electrical signal based on an amount of light, for example, a plurality of analog pixel signals.

The photoelectric conversion element may be, for example, a photodiode, a pinned diode, or the like. In addition, the photoelectric conversion element may be a single-photon avalanche diode (SPAD) applied to a three-dimensional (3D) sensor pixel.

A level of the analog pixel signal output from the photoelectric conversion element may be proportional to an amount of charge output from the photoelectric conversion element. For example, a level of the analog pixel signal output from the photoelectric conversion element may be determined based on an amount of light received into the pixel array 140.

The plurality of row lines RL may be connected to the plurality of pixels PX. For example, a control signal output from the row driver 130 to the row line RL may be transferred to each transistor gate of the plurality of pixels PX that is connected to the corresponding row line RL. The column line CL may be disposed to cross the row line RL, and connected to the plurality of pixels PX. The plurality of pixel signals output from the plurality of pixels PX may be transferred to the readout circuit 150 through the plurality of column lines CL.

Figure 2:
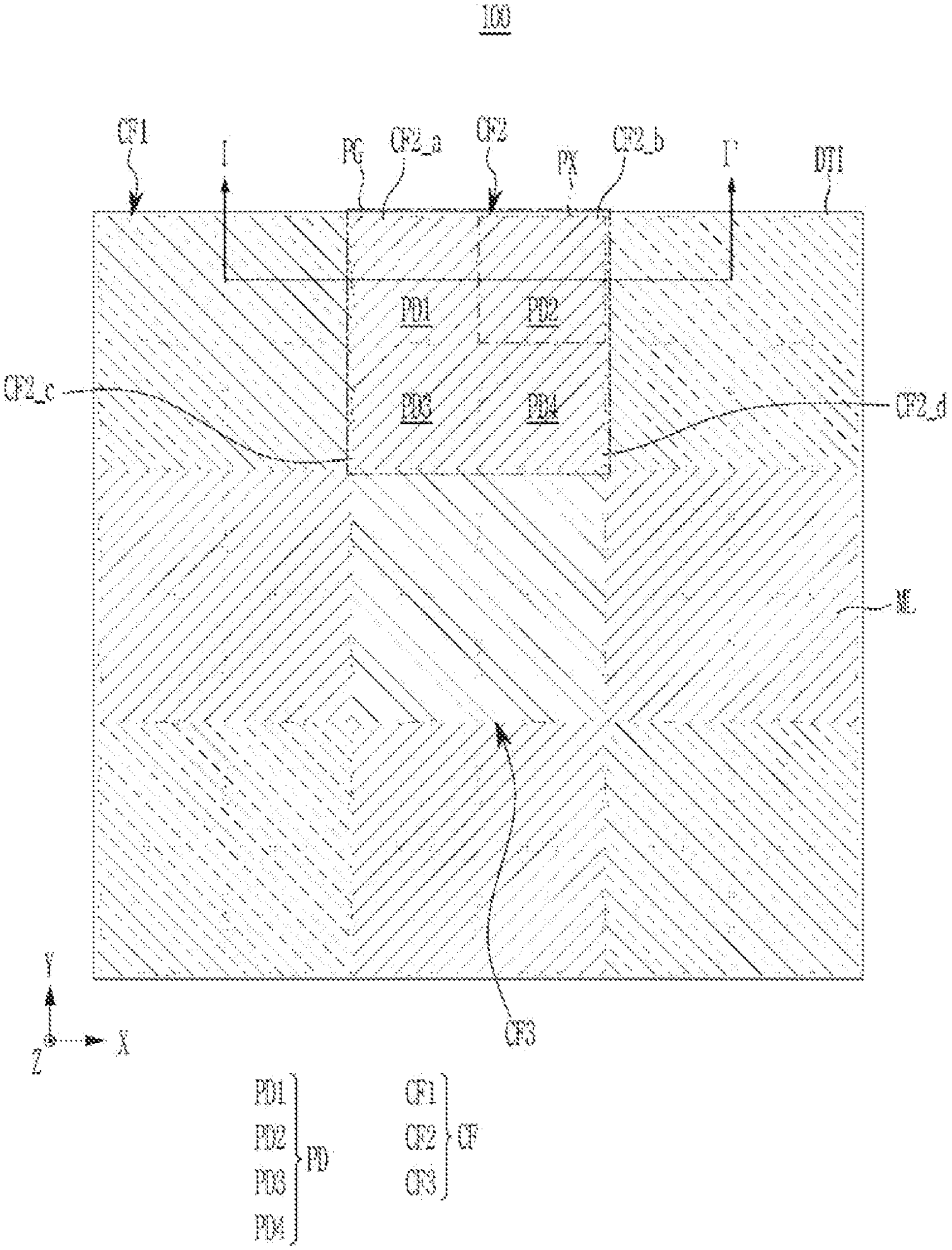
FIG. 2 is a plan view of the image sensor according to an embodiment of the present inventive concept.

In an embodiment of the present inventive concept, the plurality of pixels PX may be grouped in the form of a plurality of columns and a plurality of rows to form one unit pixel group (refer to 'PG' in FIG. 2). For example, one unit pixel group PG may include the plurality of pixels PX, which are disposed in an arrangement direction of the column line CL, and the plurality of pixels PX, which are disposed in an arrangement direction of the row line RL. For example, one unit pixel group PG may include the plurality of pixels PX arranged in two columns and two rows, and one unit pixel group PG may output one analog pixel signal. However, an embodiment of the present inventive concept is not limited thereto, and may be variously modified.

The controller 110 may also control an operation timing of each of the aforementioned components 120, 130, 150, 160, and 170 by using the control signals.

In an embodiment of the present inventive concept, the controller 110 may receive a mode signal, which indicates an imaging mode from an application processor, and may entirely control the image sensor 100 based on the received mode signal. For example, the application processor may determine the imaging mode of the image sensor 100 based on various scenarios such as illumination of an imaging environment, a user's resolution setting, sensed or learned states to provide a determination result to the controller 110 through the mode signal.

The controller 110 may control the plurality of pixels PX of the pixel array 140 to output the pixel signal based on the imaging mode. The pixel array 140 may output the pixel signal for each of the plurality of pixels PX or the pixel signals for some of the plurality of pixels PX, and the readout circuit 150 may sample and process the pixel signals received from the pixel array 140.

The timing generator 120 may generate a signal serving as a reference for the operation timing of the components of the image sensor 100. The timing generator 120 may control a timing of each of the row driver 130, the readout circuit 150, and the ramp signal generator 160. The timing generator 120 may provide the control signal for controlling the timing of each of the row driver 130, the readout circuit 150, and the ramp signal generator 160.

The row driver 130 may generate the control signal for driving the pixel array 140 in response to the control signal of the timing generator 120, and the row driver 130 may provide the control signal to the plurality of pixels PX of the pixel array 140 through the plurality of row lines RL.

In an embodiment of the present inventive concept, the row driver 130 may perform the control for the pixels PX to detect incident light in a row line unit. The row line unit may include at least one row line RL. For example, the row driver 130 may generate a transmission signal for controlling a transmission transistor, a reset control signal for controlling a reset transistor, a selection control signal for controlling the selected transistor, or the like, and the row driver 130 may provide the generated signals to the pixel array 140.

The readout circuit 150 may convert, into a pixel value representing the amount of light, the pixel signal (or, e.g., the electrical signal) from the pixel PX, which are connected to the row line RL, selected from the plurality of pixels PX in response to the control signal from the timing generator 120.

The readout circuit 150 may convert the pixel signal output through the corresponding column line CL into the pixel value. For example, the readout circuit 150 may convert the pixel signal into the pixel value by comparing a ramp signal and the pixel signal. The pixel value may be image data having a plurality of bits. For example, the readout circuit 150 may include a selector, a plurality of comparators, and a plurality of counter circuits.

The ramp signal generator 160 may generate a reference signal and transmit the same to the readout circuit 150. The ramp signal generator 160 may include a current source, a resistor, and a capacitor. The ramp signal generator 160 may adjust a magnitude of current of a variable current source or a resistance value of a variable resistor to adjust a ramp voltage, which is the voltage applied to the ramp resistor, thereby generating the plurality of ramp signals that are each falling or rising with an incline determined by the magnitude of the current of the variable current source or the resistance value of the variable resistor.

The data buffer 170 may store the pixel values of the plurality of pixels PX, which are connected to the selected column line CL, that are transferred from the readout circuit 150, and the data buffer 170 may output the stored pixel value in response to an enable signal from the controller 110.

The image signal processor 180 may perform image signal processing on the image signal received from the data buffer 170. For example, the image signal processor 180 may receive the plurality of image signals from the data buffer 170, and may generate one image by synthesizing the received image signals together.

Figure 3:
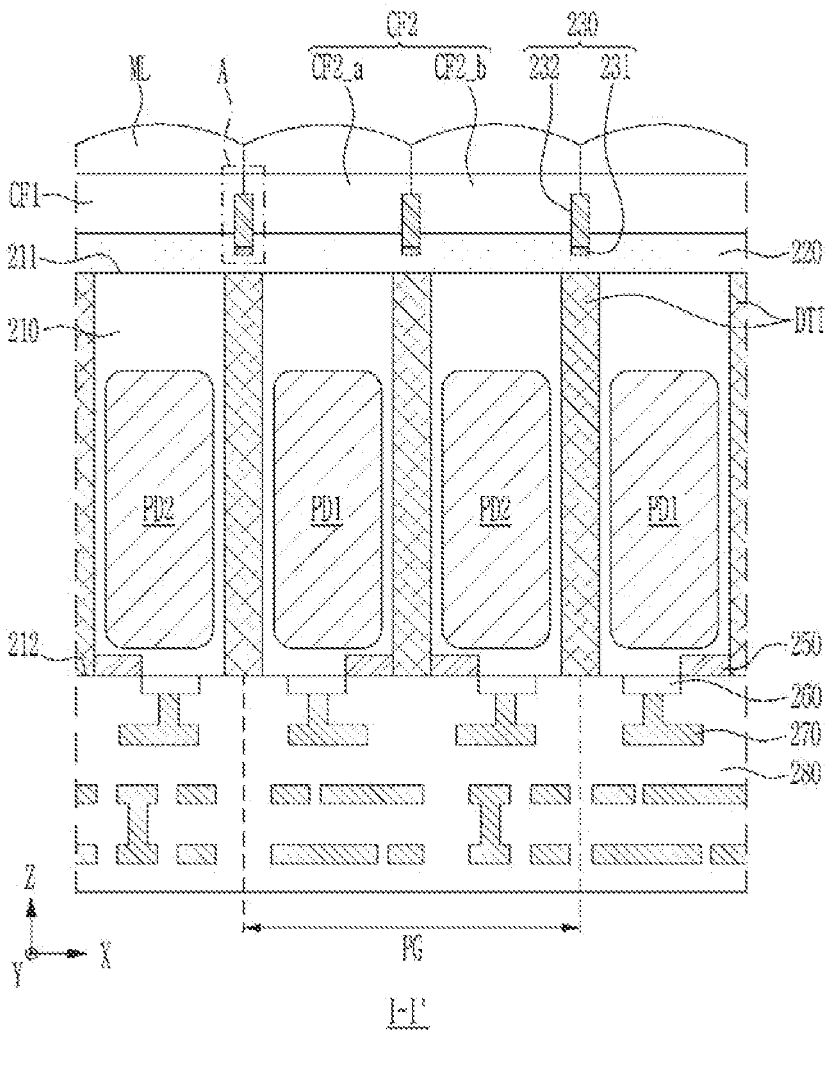
FIG. 3 is a cross-sectional view taken along line I-I' of FIG. 2.
Figure 4:
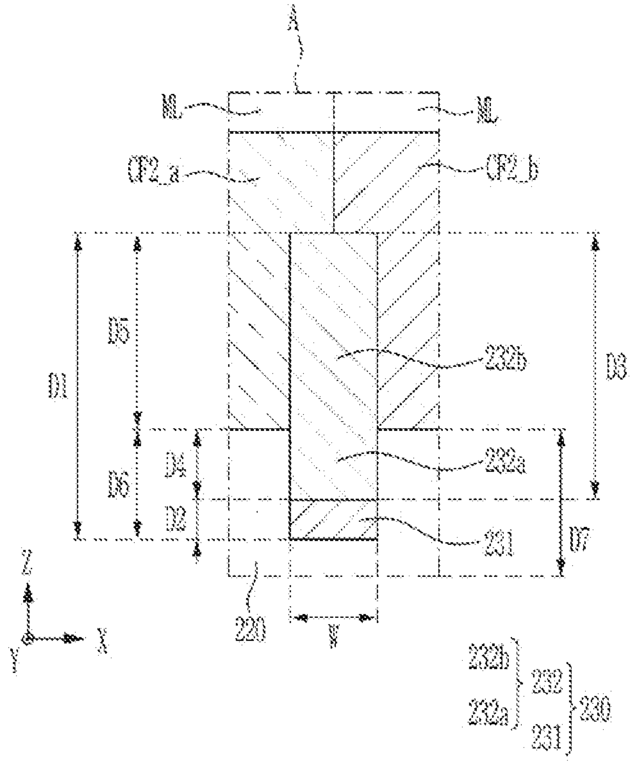
FIG. 4 is an enlarged view of a region A of FIG. 3.

FIG. 2 is a plan view of the image sensor according to an embodiment of the present inventive concept. FIG. 3 is a cross-sectional view taken along line I-I' of FIG. 2. FIG. 4 is an enlarged view of a region A of FIG. 3.

In detail, FIG. 2 is a plan view partially showing the image sensor 100 according to an embodiment of the present invention.

Referring to FIGS. 2 to 4, the image sensor 100 according to an embodiment of the present invention may include pixel groups PG, a substrate 210, photodiodes PD, an element isolation film DTI, and an anti-reflection layer 220, color filters CF, micro lenses ML, and other circuits for an operation of the image sensor 100.

The substrate 210 may be made of, for example, bulk silicon or silicon-on-insulator (SOI). The substrate 210 may be a silicon substrate or may include a material such as silicon germanium, indium antimonide, lead telluride, indium arsenide, indium phosphide, gallium arsenide, or gallium antimonide. In addition, the substrate 210 may have an epitaxial layer formed on a base substrate. For example, the substrate 210 may be doped with a conductive impurity. For example, the substrate 210 may be doped with a P-type conductive impurity.

The substrate 210 may include a first surface 211 and a second surface 212 opposite to each other. The first surface 211 of the substrate 210 may be a light-receiving surface through which light may be incident. For example, the first surface 211 may be a front surface of the substrate 210, and the second surface 212 may be a rear surface of the substrate 210.

The plurality of pixel groups PG may be arranged in two dimensions under the first surface 211 of the substrate 210. The pixel group PG, which overlaps a first color filter CF1, may detect light of a first color. The pixel group PG overlapping a second color filter CF2 may detect light of a second color that is different from the first color, and the pixel group PG overlapping a third color filter CF3 may detect light of a third color that is different from the first and second colors.

Each of the plurality of pixel groups PG may include N×M pixels PX in an N×M array. The N and the M may each independently be an integer greater than 1. For example, each number of N and M may be 2, and each of the plurality of pixel groups PG may have a 2×2 Tetra structure pixel array on a plane. For example, each of the plurality of pixel groups PG may include the pixels PX arranged in the 2×2 array on a plane, under the first surface 211 of the substrate 210. However, an embodiment of the present inventive concept is not limited thereto, and the number of pixels PX included in one pixel group PG may be variously modified.

The pixels PX included in each of the plurality of pixel groups PG may be separated from each other by the element isolation film DTI. For example, the element isolation film DTI may be disposed between the adjacent pixels PX in the substrate 210, and may define the pixels PX included in each of the plurality of pixel groups PG. For example, the element isolation film DTI may have a planar lattice shape to separate the pixels PX from each other. The element isolation film DTI may extend in a third direction (or, e.g., a Z direction) based on a cross section of the image sensor, and may be connected to the first surface 211 and the second surface 212 of the substrate 210. However, the present inventive concept is not limited thereto, and may be spaced apart from the second surface 212 of the substrate 210 without passing through the substrate 210 in some embodiments of the present inventive concept.

In addition, in some embodiments of the present inventive concept, the element isolation film DTI may further include separation patterns protruding in a first direction (or, e.g., an X direction) and/or a second direction (or, e.g., a Y direction) from a side surface of the element isolation film DTI on a plane. For example, the separation patterns protruding from the side surface of the element isolation film DTI may respectively protrude from one side of the element isolation film DTI and the other side, which is opposite to the one side in the first direction (or, e.g., the X direction), and the separation patterns may be spaced apart from each other in the first direction (or, e.g., the X direction). When the element isolation film DTI further includes the separation patterns as such, the pixels PX may be separated from each other by the separation patterns of the element isolation film DTI.

The element isolation film DTI may be an insulating film for separating the pixels PX from each other in one pixel group PG. In addition, the element isolation film DTI may be an insulating film for increasing performance of the image sensor 100 by controlling movement of electrons within one pixel group PG.

In an embodiment of the present inventive concept, the element isolation film DTI may be made of an insulating material having a lower refractive index than that of the substrate 210, and may include one or more insulating films. For example, the element isolation film DTI may be made of a silicon oxide film, a silicon nitride film, an undoped polysilicon film, and air, or a combination thereof.

In some embodiments of the present inventive concept, the element isolation film DTI may include a sidewall and electrodes. The sidewall of the element isolation film DTI may be made of the insulating material having a different refractive index from that of the substrate 210 (e.g., high reflectivity). For example, the sidewall may include at least one of a silicon oxide film, a silicon nitride film, and/or a silicon oxynitride film, and is not limited thereto. The sidewall may prevent optical crosstalk in which a signal-to-noise ratio may be reduced by transmitting light that is incident into the pixel PX to other adjacent pixels PX.

The electrode of the element isolation film DTI may be made of a conductive material that fills an inner region of the sidewall in the element isolation film DTI. For example, the electrode may be made of polysilicon or doped polysilicon, and is not limited thereto.

As a negative voltage is applied to the electrode, electrons in the electrode may move to be closer to the sidewall, and positive holes in the substrate 210 may thus move to, may be accumulated on, and may be fixed to a boundary surface of the sidewall of the element isolation film DTI. As described above, the positive holes in the substrate 210 may be accumulated on and fixed to the boundary surface of the sidewall of the element isolation film DTI, thereby suppressing a dark current, that is, a flow of defect electrons occurring on the surface of the substrate 210 due to an element isolation film DTI process.

The photodiodes PD for receiving light may be disposed in each pixel group PG in the substrate 210. Light incident from the outside may be converted into the electrical signal by the photodiode PD.

The photodiodes PD may respectively be disposed in the pixels PX that are included in each pixel group PG. Accordingly, the element isolation film DTI may be disposed between adjacent photodiodes PD. The element isolation film DTI may be disposed between the photodiodes PD to electrically and optically isolate the photodiodes PD from each other. For example, the photodiodes PD disposed in the pixel group PG may respectively correspond to each pixel PX, and may include first to fourth photodiodes PD1, PD2, PD3, and PD4 that are adjacent to each other. The element isolation film DTI may extend in the first direction (or, e.g., the X direction) and the second direction (or, e.g., the Y direction) on a plane, and may be disposed between the first to fourth photodiodes PD1, PD2, PD3, and PD4 that are adjacent to each other.

The photodiode PD may be doped with the conductive impurity that is different from the conductive impurity doped on the substrate 210. For example, the photodiode PD may be doped with an N-type conductive impurity.

The color filters CF may be disposed on the element isolation film DTI and on the first surface 211 of the substrate 210. The color filters CF may include the first color filter CF1, the second color filter CF2, and the third color filter CF3. For example, the first color filter CF1 may be a red color filter, the second color filter CF2 may be a green color filter, and the third color filter CF3 may be a blue color filter.

In an embodiment of the present inventive concept, the color filter CF may include N×M sub-color filters in the N×M array, just like the pixel group PG. For example, the sub-color filters may be arranged to correspond to the arrangement of the pixels PX of the pixel group PG. The N and the M may each independently be the integer greater than 1. For example, each number of N and M may be 2, and the color filter CF may have the 2×2 Tetra pattern on a plane. For example, the second color filter CF2 may include a first sub-color filter CF2_*a*, a second sub-color filter CF2_*b*, a third sub-color filter CF2_*c*, and a fourth sub-color filter CF2_*d*, respectively corresponding to the pixels PX.

In addition, the first sub-color filter CF2_*a*, the second sub-color filter CF2_*b*, the third sub-color filter CF2_*c*, and the fourth sub-color filter CF2_*d* may respectively correspond to the first to fourth photodiodes PD1, PD2, PD3, and PD4. However, the present inventive concept is not limited thereto, and the number of sub-color filters included in one color filter CF may be variously modified.

The micro lens ML condensing light incident from the outside may be disposed on each of the color filters CF. The micro lens ML may be disposed to correspond to the pixel PX. For example, one micro lens ML may be disposed on one pixel PX. Accordingly, each of the plurality of pixel groups PG may include the micro lenses ML in the 2×2 array. For example, in one pixel group PG, a ratio of the number of color filters CF to the number of micro lenses ML may be 1:4. For example, the micro lens ML may be disposed on each of the first sub-color filter CF2_*a*, the second sub-color filter CF2_*b*, the third sub-color filter CF2_*c*, and the fourth sub-color filter CF2_*d*, included in the second color filter CF2.

In an embodiment of the present inventive concept, an upper surface of the micro lens ML may have a curved surface, unlike an upper surface of the color filter CF. However, the upper surface of the micro lens ML is not limited thereto, and may have a shape of a rectangle having a rounded corner in some embodiments of the present inventive concept. In some embodiments of the present inventive concept, the upper surface of the color filter CF may have the same curved surface as the upper surface of the micro lens ML, or may have the shape of a rectangle having a rounded corner.

The anti-reflection layer 220 may be interposed between the color filter CF and the first surface 211 of the substrate 210. The anti-reflection layer 220 may cover the first surface 211 of the substrate 210 and an upper surface of the element isolation film DTI. For example, an upper surface of the anti-reflection layer 220 may be in contact with a lower surface of the color filter CF, and a lower surface of the anti-reflection layer 220 may be in contact with the upper surface of the first surface 211 of the substrate 210 and the upper surface of the element isolation film DTI. However, the present inventive concept is not limited thereto, and another layer may be disposed between the color filter CF and the anti-reflection layer 220 and between the first surface 211 of the substrate 210 and the anti-reflection layer 220.

The anti-reflection layer 220 may include at least one of, for example, silicon oxide, silicon nitride, silicon oxynitride, aluminum oxide, hafnium oxide, or a combination thereof, and is not limited thereto.

In addition, the anti-reflection layer 220 is shown as a single layer in FIG. 3, but the present inventive concept is not limited thereto. In some embodiments of the present inventive concept, the anti-reflection layer 220 may include a plurality of different materials and be a multi-layer structure having layers with thicknesses that are different from each other. For example, the anti-reflection layer 220 may include first to third anti-reflection layers sequentially stacked on the first surface 211 of the substrate 210.

The first anti-reflection layer may be a fixed charge layer having a negative fixed charge. The positive hole accumulation may occur in vicinity of the fixed charge layer, thus effectively reducing occurrences of the dark current and a white spot.

The third anti-reflection layer may include, for example, metal oxide or metal fluoride, including at least one of hafnium (Hf), zirconium (Zr), aluminum (Al), tantalum (Ta), titanium (Ti), and yttrium (Y). For example, the first anti-reflection layer and the third anti-reflection layer may each include a hafnium oxide layer, and the second anti-reflection layer may include silicon oxide or silicon nitride. However, in some embodiments of the present inventive concept, the number and relative thickness of the layers included in the anti-reflection layer 220 may be variously modified.

In addition, in some embodiments of the present inventive concept, the anti-reflection layer 220 may further include a silicon nitride layer disposed between the second anti-reflection layer and the third anti-reflection layer.

A fence pattern 230 may overlap the element isolation film DTI in the third direction (or, e.g., the Z direction). In addition, the fence patterns 230 may at least partially surround the pixels PX and the color filters CF on a plane.

The fence pattern 230 may be disposed between the color filters CF. For example, the fence pattern 230 may be disposed between the color filters CF in the first direction (or, e.g., the X direction). For example, the fence pattern 230 may be disposed on a boundary surface between the first color filter CF1 and the second color filter CF2. In addition, the fence pattern 230 may be disposed on a boundary surface between the first sub-color filter CF2_*a* and the second sub-color filter CF2_*b*, included in the second color filter CF2. However, the present inventive concept is not limited thereto, and in some embodiments of the present inventive concept, the fence patterns 230 may omit the fence pattern 230 disposed on the boundary surface between the first sub-color filter CF2_*a* and the second sub-color filter CF2_*b*, included in the second color filter CF2.

The fence pattern 230 may extend from the color filter CF to the anti-reflection layer 220 in the third direction (or, e.g., the Z direction). Accordingly, an upper surface of the fence pattern 230 may be disposed in the color filter CF, and a lower surface of the fence pattern 230 may be disposed in the anti-reflection layer 220. For example, the upper surface of the fence pattern 230 may be disposed at a level between the upper and lower surfaces of the color filter CF, and the lower surface of the fence pattern 230 may be disposed at a level between the upper and lower surfaces of the anti-reflection layer 220. For example, the fence pattern 230 may partially penetrate the anti-reflection layer 220.

The fence patterns 230 may include a first layer 231 and a second layer 232 sequentially stacked from the first surface 211 of the substrate 210, and may overlap the element isolation film DTI in the third direction (or, e.g., the Z direction).

For example, the first layer 231 may be disposed in the anti-reflection layer 220. For example, the first layer 231 may be disposed at a level between the upper and lower surfaces of the anti-reflection layer 220. Accordingly, a lower surface of the first layer 231 of the fence pattern 230 may be spaced apart from the upper surface of the element isolation film DTI in the third direction (or, e.g., the Z direction). For example, the anti-reflection layer 220 may be disposed between the first layer 231 and the element isolation film DTI.

The second layer 232 of the fence pattern 230 may include a first part 232*a* and a second part 232*b* disposed on the first part 232*a*.

Like the first layer 231, the first part 232*a* may be disposed in the anti-reflection layer 220. The first part 232*a* may be disposed between the first layer 231 and the second part 232*b* of the second layer 232. For example, an upper surface of the first part 232*a* may be in contact with a lower surface of the second part 232*b*, and a lower surface of the first part 232*a* may be in contact with the upper surface of the first layer 231. For example, the upper surface of the first part 232*a* may be disposed on substantially the same level as the upper surface of the anti-reflection layer 220, and the lower surface of the first part 232*a* may be disposed on substantially the same level as the upper surface of the first layer 231.

The second part 232*b* may be disposed in the color filter CF. An upper surface of the second part 232*b* may be spaced apart from the upper surface of the color filter CF, and a lower surface of the second part 232*b* may be in contact with the upper surface of the first part 232*a*. For example, the upper surface of the second part 232*b* may be disposed at a level between the upper and lower surfaces of the color filter CF, and the lower surface of the second part 232*b* may be disposed on substantially the same level as the upper surface of the anti-reflection layer 220. In some embodiments of the present inventive concept, the first part 232*a* of the second layer 232 and the second part 232*b* may be a single body. However, the present inventive concept is not limited thereto, and for example, the first part 232*a* and the second part 232*b* may be two individual bodies that may have an interface therebetween when they are stacked on each other.

In an embodiment of the present inventive concept, the fence pattern 230 may have a first thickness D1 in the third direction (or, e.g., the Z direction), and the first layer 231 of the fence pattern 230 may have a second thickness D2 in the third direction (or, e.g., the Z direction). The second layer 232 of the fence pattern 230 may have a third thickness D3 in the third direction (or, e.g., the Z direction).

The first part 232*a* of the second layer 232 may have a fourth thickness D4 in the third direction (or, e.g., the Z direction), and the second part 232*b* of the second layer 232 may have a fifth thickness D5 in the third direction (or, e.g., the Z direction). For example, the third thickness D3 may be the sum of the fourth thickness D4 and the fifth thickness D5.

Among the fence patterns 230 disposed in the anti-reflection layer 220 and the color filter CF, the fence pattern 230 disposed in the anti-reflection layer 220 may have a sixth thickness D6 in the third direction (or, e.g., the Z direction). For example, the sixth thickness D6 may be the sum of the second thickness D2 of the first layer 231 of the fence pattern 230 and the fourth thickness D4 of the first part 232*a* of the second layer 232. In addition, the anti-reflection layer 220 may have a seventh thickness D7 in the third direction (or, e.g., the Z direction).

In an embodiment of the present inventive concept, the thickness D1 of the fence pattern 230 in the third direction (or, e.g., the Z direction) may be greater than a width W of the fence pattern 230 in the first direction (or, e.g., the X direction). Accordingly, the fence pattern 230, which is between the color filters CF, may extend from the color filter CF to the anti-reflection layer 220, and may have a rectangular shape based on the cross section. However, the present inventive concept is not limited thereto, and the cross-sectional shape of the fence pattern 230 may be variously modified. A detailed description thereof is provided below with reference to FIGS. 5 to 8.

The thickness of the first layer 231 of the fence pattern 230 may be smaller than the thickness of the second layer 232. The thickness of the first part 232*a* of the second layer 232 may be smaller than the thickness of the second part 232*b* of the second layer 232. In addition, the thickness of the first layer 231 may be smaller than the thickness of the first part 232*a* of the second layer 232, and the thickness of the first layer 231 may be smaller than the thickness of the second part 232*b* of the second layer 232. For example, the second thickness D2 may be smaller than the third thickness D3, and the fourth thickness D4 may be smaller than the fifth thickness D5. In addition, the second thickness D2 may be smaller than the fourth thickness D4 and the fifth thickness D5.

In an embodiment of the present inventive concept, a ratio of the second thickness D2 to the fourth thickness D4 may be about 0.5:10 to about 3:10. For example, a ratio of the second thickness D2 to the fourth thickness D4 may be about 1:10 to about 2.5:10. However, the ratio of the second thickness D2 to the fourth thickness D4 is not limited to the aforementioned numerical range, and may be variously modified.

In an embodiment of the present inventive concept, a ratio of the fourth thickness D4 to the first thickness D1 may be about 0.25:10 to about 3:10. For example, a ratio of the fourth thickness D4 to the first thickness D1 may be about 1:10 to about 2.5:10. However, the ratio of the fourth thickness D4 to the first thickness D1 is not limited to the aforementioned numerical range and may be variously modified.

In an embodiment of the present inventive concept, the thickness of the anti-reflection layer 220 may be greater than the sum of the thickness of the first layer 231 of the fence pattern 230 and the thickness of the first part 232*a* of the second layer 232. For example, the seventh thickness D7 may be greater than the sum of the second thickness D2 and the fourth thickness D4.

A ratio of the fourth thickness D4 to the seventh thickness D7 may be about 1:10 to about 9:10. For example, a ratio of the fourth thickness D4 to the seventh thickness D7 may be about 1:10 to about 7:10. However, the ratio of the fourth thickness D4 to the seventh thickness D7 is not limited to the aforementioned numerical range and may be variously modified.

In an embodiment of the present inventive concept, the first layer 231 and second layer 232 of the fence pattern 230 may include different materials from each other.

For example, the first layer 231 of the fence pattern 230 may include the conductive material. For example, the first layer 231 may include at least one of titanium (Ti), titanium nitride (TiN), tungsten (W), aluminum (Al), and copper (Cu). In addition, the first layer 231 may include at least one of a metal material and a metal nitride. However, the material included in the first layer 231 is not limited thereto, and may be variously modified.

The second layer 232 of the fence pattern 230 may be an insulating layer which has a low refractive index (LRI) layer having a refractive index lower than those of the anti-reflection layer 220 and the color filter CF, and the second layer 232 may have, for example, a refractive index in the range of about 1.1 to about 1.8. However, the refractive index of the second layer 232 is not limited to the aforementioned numerical range, and may be variously modified.

The first part 232*a* and second part 232*b* of the second layer 232 may each include the insulating material, for example, oxide or nitride including silicon (Si), aluminum (Al), or a combination thereof. For example, the second layer 232 may include porous silicon oxide or silica nanoparticles having a network structure. However, the insulating material is not limited thereto, and may be variously modified.

In addition, unlike the first part 232*a* and second part 232*b* of the second layer 232 including the same insulating material in an embodiment of the present inventive concept, the first part 232*a* and second part 232*b* of the second layer 232 may include different insulating materials from each other in some embodiments of the present inventive concept.

A pixel circuit may be disposed on the second surface 212 of the substrate 210. The pixel circuit may include a plurality of elements 260, wiring patterns 270 connected to the plurality of elements 260, an insulating layer 280 covering the plurality of elements 260 and the wiring patterns 270, and the like.

The pixel circuit may further include a floating diffusion region 250. Each pixel PX may include the floating diffusion region 250 that is disposed under the photodiodes PD1 and PD2. The respective floating diffusion regions 250 may be electrically connected to each other by at least one of the wiring patterns 270, and the disposition and area of each floating diffusion region 250 may be variously modified in some embodiments of the present inventive concept.

In the image sensor 100 according to an embodiment of the present inventive concept, each of the plurality of elements 260 adjacent to the floating diffusion region 250 may be the transmission transistor. At least a portion of a transmission transistor gate may be vertically disposed in the substrate 210. However, the disclosure is not limited thereto, and in some embodiments, the transmission transistors in one pixel PX may share one floating diffusion region 250 with each other.

The image sensor 100 according to an embodiment of the present inventive concept may secure increased image quality as the fence pattern 230, which is disposed on the boundary between the color filters CF, extends to the color filter CF and the anti-reflection layer 220, which is disposed under the color filter CF, thereby suppressing the crosstalk between the pixels PX. For example, the first layer 231 of the fence pattern 230, which is disposed in the anti-reflection layer 220 and includes the conductive material, may absorb light incident to the adjacent pixels PX.

In addition, the second layer 232 of the fence pattern 230, which is disposed in the color filter CF and the anti-reflection layer 220 and includes the insulating material, may have a lower refractive index than that of the color filter CF and the anti-reflection layer 220 to reflect light incident from the outside to the corresponding pixels PX, thereby preventing light from entering the adjacent pixels PX. Therefore, it is possible to provide the image sensor 100 with higher light efficiency by reducing crosstalk between the pixels PX by the fence patterns 230 being disposed on the boundary between the color filters CF.

Hereinafter, the description describes the image sensor with reference to FIGS. 5 to 17 according to some embodiments of the present inventive concept. In the following examples, the same reference numerals refer to the same component as in an embodiment of the present inventive concept described above, and redundant descriptions thereof are omitted or simplified. In addition, in the following examples, differences from the embodiment described above are mainly described.

FIGS. 5 to 8 are enlarged views each showing the region A of FIG. 3 according to some embodiments of the present inventive concept. In detail, FIGS. 5 to 8 are views showing fence patterns having various cross sections according to some embodiments of the present inventive concept.

Fence patterns 230_1, 230_2, 230_3, and 230_4 in the examples shown in FIGS. 5 to 8 may respectively include first layers 231_1, 231_2, 231_3, and 231_4 and second layers 232_1, 232_2, 232_3, and 232_4, sequentially stacked from the bottom.

The second layers 232_1, 232_2, 232_3, and 232_4 may respectively include first parts 232_1*a*, 232_2*a*, 232_3*a*, and 232_4*a*, disposed in the anti-reflection layer 220, and second parts 232_1*b*, 232_2*b*, 232_3*b*, and 232_4*b*, disposed in the color filter CF.

Figure 5:
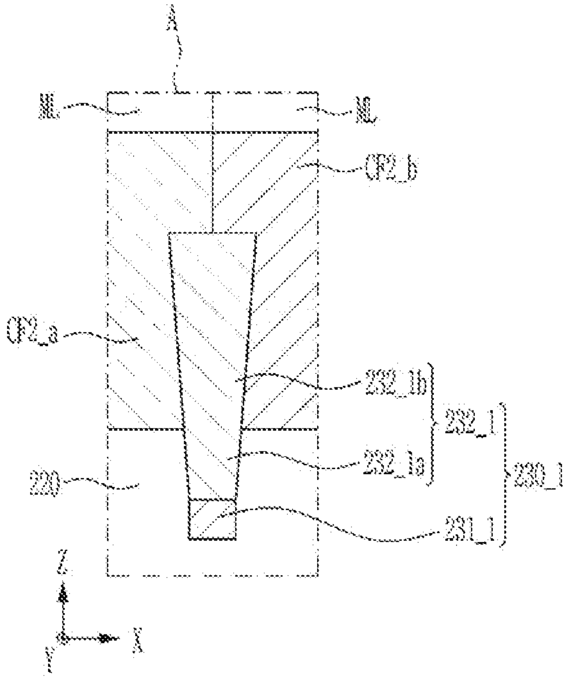
FIGS. 5, 6, 7 and 8 are enlarged views each showing the region A of FIG. 3 according to some embodiments of the present inventive concept.
Figure 6:
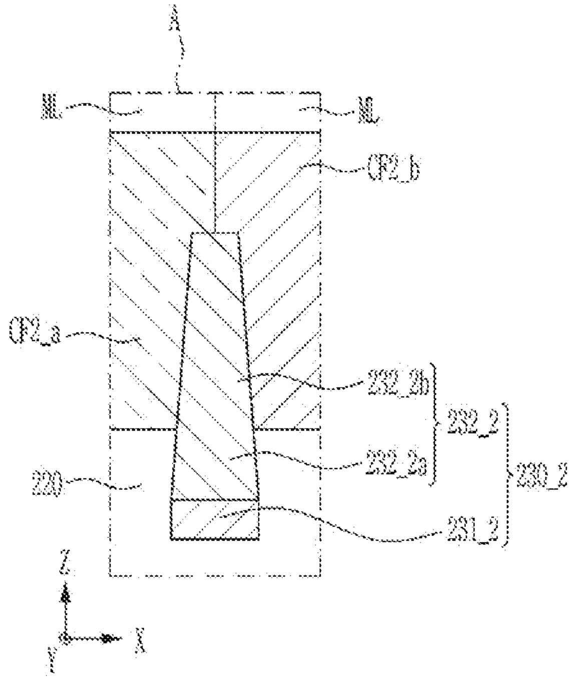

According to the embodiments shown in FIGS. 5 and 6, unlike the embodiment shown in FIG. 4, at least a portion of each of two side surfaces of the fence pattern 230_1 or 230_2 may include an inclined side surface with respect to the first surface 211 of the substrate 210.

For example, referring to FIG. 5, the first layer 231_1 of the fence pattern 230_1 might not include the inclined side surface, and accordingly, the first layer 231_1 may have a predetermined width in the first direction (or, e.g., the X direction).

Unlike the first layer 231_1, each of two side surfaces of the second layer 232_1 of the fence pattern 230_1 may be inclined with respect to the first surface 211 of the substrate 210 such that the second layer 232_1 is formed with a reverse tapered shape. Accordingly, the second layer 232_1 of the fence pattern 230_1 may have an inverted trapezoidal shape based on the cross section.

A width of the second layer 232_1 in the first direction (or, e.g., the X direction) may be increased from the lower surface of the second layer 232_1 to the upper surface of the second layer 232_1. For example, the second part 232_1*b* of the second layer 232_1 may have a width greater than that of the first part 232_1*a*, and the upper surface of the second layer 232_1 may have a width greater than that of the lower surface of the second layer 232_1 in the first direction (or, e.g., X direction).

In addition, the upper surface of the second layer 232_1 in the first direction (or, e.g., the X direction) may have a width greater than that of the first layer 231_1, and the lower surface of the second layer 232_1 may have a width substantially equal to that of the first layer 231_1 in the first direction (or, e.g., the X direction). However, the present inventive concept is not limited thereto, and in some embodiments of the present inventive concept, similar to the second layer 232_1, each of the two side surfaces of the first layer 231_1 of the fence pattern 230_1 may include an incline that is inclined with respect to the first surface 211 of the substrate 210. For example, the width of the first layer 231_1 in the first direction (or, e.g., the X direction) may be increased from the lower surface of the anti-reflection layer 220 toward the upper surface of the anti-reflection layer 220. Accordingly, the fence pattern 230_1 may have an inverted triangular shape or an inverted trapezoidal shape based on the cross section.

Referring to FIG. 6, a side surface of the first layer 231_2 of the fence pattern 230_2 might not include an inclined side surface, and accordingly, the first layer 231_2 may have a predetermined width in the first direction (or, e.g., the X direction).

Unlike the first layer 231_2, each of two side surfaces of the second layer 232_2 of the fence pattern 230_2 may be inclined with respect to the first surface 211 of the substrate 210 such that the second layer 232_2 is formed with a tapered shape. Accordingly, the second layer 232_2 of the fence pattern 230_2 may have a trapezoidal shape based on the cross section.

A width of the second layer 232_2 in the first direction (or, e.g., the X direction) may be decreased from the lower surface of the second layer 232_2 to the upper surface of the second layer 232_2. For example, the second part 232_2*b* of the second layer 232_2 may have a width smaller than the first part 232_2*a*, and the upper surface of the second layer 232_2 may have a width smaller than that of the lower surface of the second layer 232_2 in the first direction (or, e.g., the X direction).

In addition, the upper surface of the second layer 232_2 may have a width in the first direction (or, e.g., the X direction) smaller than that of the first layer 231_2, and the lower surface of the second layer 232_2 may have a width substantially equal to that of the first layer 231_2 in the first direction (or, e.g., the X direction). However, the present inventive concept is not limited thereto, and in some embodiments of the present inventive concept, similar to the second layer 232_2, each of the two side surfaces of the first layer 231_2 of the fence pattern 230_2 may include an incline that is inclined with respect to the first surface 211 of the substrate 210. For example, the width of the first layer 231_2 in the first direction (or, e.g., the X direction) may be decreased from the lower surface of the anti-reflection layer 220 toward the upper surface of anti-reflection layer 220. Accordingly, the fence pattern 230_2 may have a trapezoidal shape based on the cross section.

Figure 7:
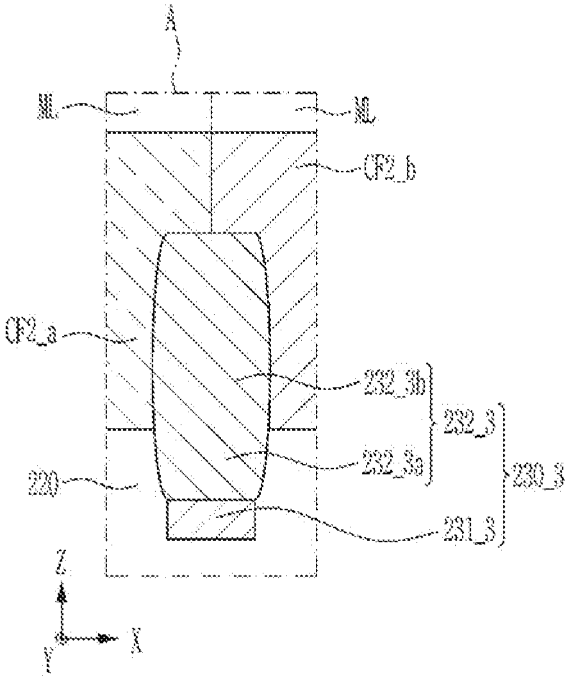

According to the embodiment shown in FIG. 7, unlike the embodiment shown in FIGS. 5 and 6, each of two side surfaces of the fence pattern 230_3 may include a curved surface.

For example, a side surface of the first layer 231_3 of the fence pattern 231_3 might not include an inclined side surface, and accordingly, the first layer 230_3 may have a predetermined width in the first direction (or, e.g., X direction).

Unlike the first layer 231_3, each of two side surfaces of the second layer 232_3 of the fence pattern 230_3 may include the curved surface. For example, each of the two side surfaces of the second layer 232_3 may have a convex shape. Accordingly, the second layer 232_3 may have a width gradually decreased in the first direction (or, e.g., the X direction) from its center to each of the lower and upper surfaces of the second layer 232_3. For example, the width of the second layer 232_3 may gradually increase and then decrease.

In addition, the lower surface and the upper surface of the second layer 232_3 may have substantially the same width as each other in the first direction (or, e.g., the X direction), and the upper surface and lower surface of the second layer 232_3 may have substantially the same width as those of the first layer 231_3. However, the present inventive concept is not limited thereto, and at least one of the lower surface and upper surface of the second layer 232_3 and at least one of the lower surface and upper surface of the first layer 231_3 may have substantially the same width as each other in the first direction (or, e.g., the X direction). In addition, each of the lower and upper surfaces of the second layer 232_3 and the lower and upper surfaces of the first layer 231_3 may have a different width from each other.

In some embodiments of the present inventive concept, like the second layer 232_3, each of two surfaces of the first layer 231_3 of the fence pattern 230_3 may include a curved surface. For example, each of the two side surfaces of the first layer 231_3 may include a curved surface. Accordingly, the first layer 231_3 may have a width gradually decreased in the first direction (e.g., the X direction) from its center to each of the lower and upper surfaces of the first layer 231_3.

Figure 8:
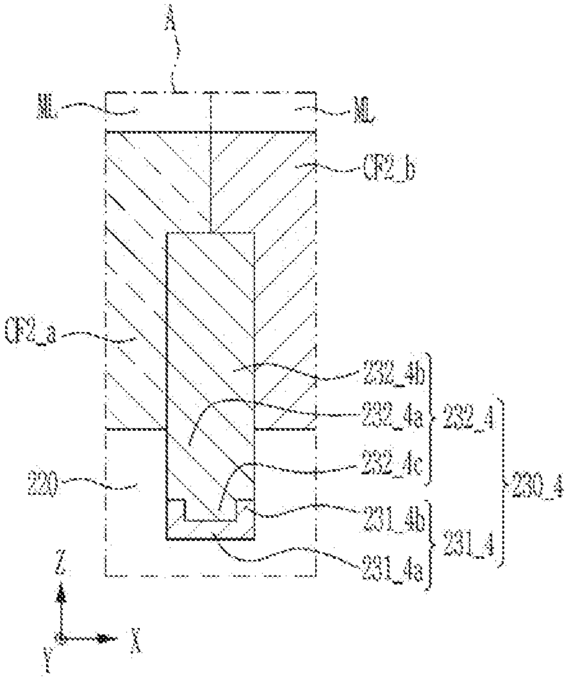

According to the embodiment shown in FIG. 8, unlike the embodiments shown in FIGS. 4 to 7, the second layer 232_4 of the fence pattern 230_4 may further include a third part **232_4*c* having a width smaller than that of the first part 232_4*a* of the second layer 232_4 in the first direction (or, e.g., the X direction), and the lower and side surfaces of the third part 232_4*c* may be surrounded by the first layer 231_4**.

For example, referring to FIG. 8, the first layer 231_4 of the fence pattern 230_4 may be disposed in the anti-reflection layer 220, and may include a first part **231_4*a*, which extends in the first direction (or, e.g., the X direction), and a second part 231_4*b*, which extends from each of two ends of the first part 231_4*a*** in the third direction (or, e.g., the Z direction).

In addition, the second layer 232_4 of the fence pattern 230_4 may further include a third part **232_4*c* disposed between the first part 232_4*a* of the first layer 231_4 and the portion of the second layer 232_4 that is in the anti-reflection layer 220, and the third part 232_4*c* has the lower and side surfaces that are surrounded by the first layer 231_4**.

The first part **231_4*a* and second part 231_4*b* of the first layer 231_4 may have substantially the same width as each other, and the first part 231_4*a* of the first layer 231_4 may be in contact with the lower surface of the third part 232_4*c* of the second layer 232_4, and the second part 231_4*b* of the first layer 231_4 may be in contact with side surfaces of the third part 232_4*c* of the second layer 232_4. For example, the second part 231_4*b* of the first layer 231_4 may be in contact with each of two side surfaces of the third part 232_4*c* of the second layer 232_4. Accordingly, the lower and side surfaces of the third part 232_4*c* of the second layer 232_4 may be at least partially surrounded by the first layer 231_4. However, the present inventive concept is not limited thereto, and the first part 231_4*a* and second part 231_4*b* of the first layer 231_4** may have different widths from each other.

The third part **232_4*c* of the second layer 232_4 may have a width smaller than those of the first part 231_4*a* of the first layer 231_4 and the first part 232_4*a* of the second layer 232_4 in the first direction (or, e.g., the X direction), and have a thickness smaller than that of the first part 232_4*a* of the second layer 232_4 in the third direction (or, e.g., the Z direction). However, the present inventive concept is not limited thereto, and the width and thickness of the third part 232_4*c* of the second layer 232_4** may be variously modified.

Figure 9:
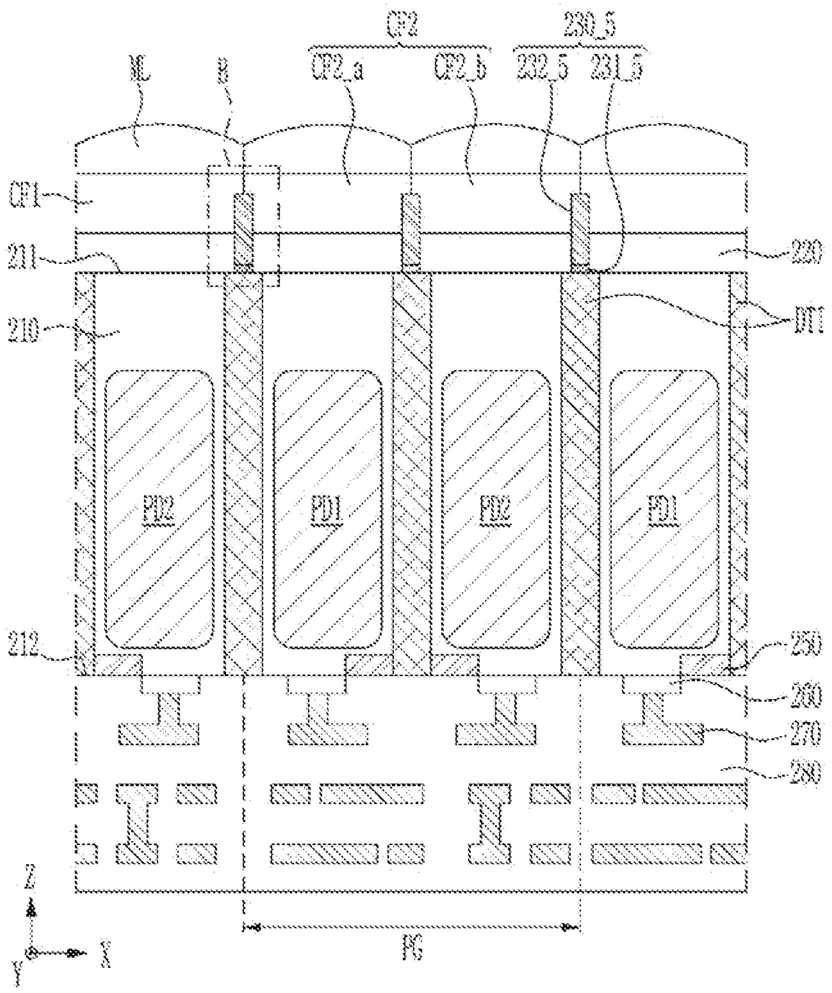
FIG. 9 is a cross-sectional view taken along line I-I' of FIG. 2 according to an embodiment of the present inventive concept.
Figure 10:
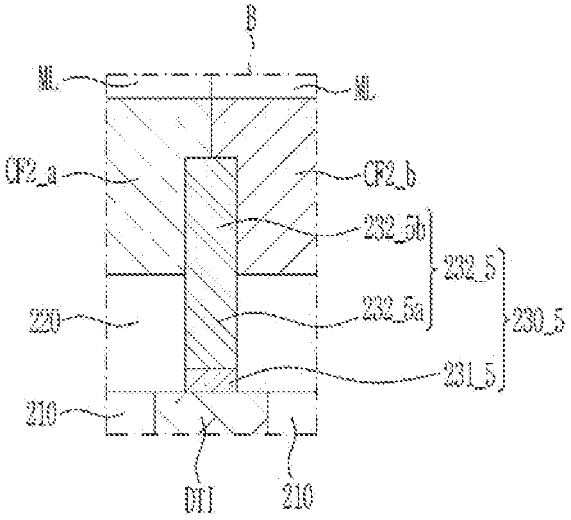
FIG. 10 is an enlarged view of a region B of FIG. 9.

FIG. 9 is a cross-sectional view taken along line I-I' of FIG. 2 according to an embodiment of the present inventive concept. FIG. 10 is an enlarged view of a region B of FIG. 9.

According to the embodiment shown in FIGS. 9 and 10, unlike the embodiment shown in FIGS. 3 and 4, fence patterns 230_5 may be in contact with the element isolation film DTI. For example, the fence pattern 230_5 may extend from the color filter CF in the third direction (or, e.g., the Z direction), and may pass through the anti-reflection layer 220, which is disposed under the color filter CF. A lower surface of the fence pattern 230_5 may be in contact with the upper surface of the element isolation film DTI.

For example, a lower surface of a first layer 231_5 of the fence pattern 230_5, which is disposed in the anti-reflection layer 220, may be in contact with the upper surface of the element isolation film DTI, and an upper surface of the first layer 231_5 may be in contact with a lower surface of a first part **232_5*a* of a second layer 232_5. Accordingly, the lower surface of the first layer 231_5 may be disposed on substantially the same level as the upper surface of the element isolation film DTI, and an upper surface of a second part 232_5*b* of the second layer 232_5** may be disposed at a level between the upper and lower surfaces of the color filter CF.

A width of the fence pattern 230_5 may be smaller than a first width of the element isolation film DTI in the first direction (or, e.g., the X direction). Accordingly, each of side surfaces (e.g., two opposing side surfaces) of the fence pattern 230_5 may be disposed on the upper surface of the element isolation film DTI, and in contact with the upper surface of the element isolation film DTI.

In addition, the width of the fence pattern 230_5 in the first direction (or, e.g., the X direction) may be smaller than the width of the element isolation film DTI, and the fence pattern 230_5 might not overlap the first surface 211 of the substrate 210. For example, the side surface of the fence pattern 230_5 may overlap the upper surface of the element isolation film DTI in the third direction (or, e.g., the Z direction), and might not overlap the first surface 211 of the substrate 210 that is adjacent to the element isolation film DTI in the third direction (or, e.g., the Z direction). However, the present inventive concept is not limited thereto, and in some embodiments of the present inventive concept, the width of the fence pattern 230_5 in the first direction (or, e.g., the X direction) may be substantially the same as the width of the element isolation film DTI. As such, the width of the fence pattern 230_5 in the first direction (or, e.g., the X direction) may be substantially the same as the width of the element isolation film DTI. In this case, the side surface of the fence pattern 230_5 may be disposed on substantially the same line as the side surface of the element isolation film DTI in the third direction (or, e.g., the Z direction), and might not overlap the first surface 211 of substrate 210 in the third direction (or Z direction). For example, the first layer 231_5 might not extend beyond the side surfaces of the element isolation film DTI to overlap and contact the first surface 211 of the substrate 210. For example, side surfaces of the first layer 231_5 may be substantially coplanar with side surfaces of the element isolation film DTI. In addition, in some embodiments of the present inventive concept, a width of the first layer 231_5 of the fence pattern 230_5 may be smaller than the width of the element isolation film DTI, and a width of the second layer 232_5 may be substantially the same as the width of the element isolation film DTI.

According to the image sensor according to this embodiment, the fence pattern 230_5, which is disposed in the boundary between the color filters CF, may pass through the color filter CF and the anti-reflection layer 220, which is disposed under the color filter CF, to be in contact with the element isolation film DTI. Accordingly, the fence pattern 230_5 may serve as a separation space with the element isolation film DTI, thereby preventing light incident from the outside from being incident to the adjacent pixels PX.

Therefore, even in the case of this embodiment, it is possible to provide an image sensor according to an embodiment of the present inventive concept with higher light efficiency by reducing the crosstalk between the pixels PX by the fence patterns 230_5 that is disposed on the boundary between the color filters CF.

Figure 11:
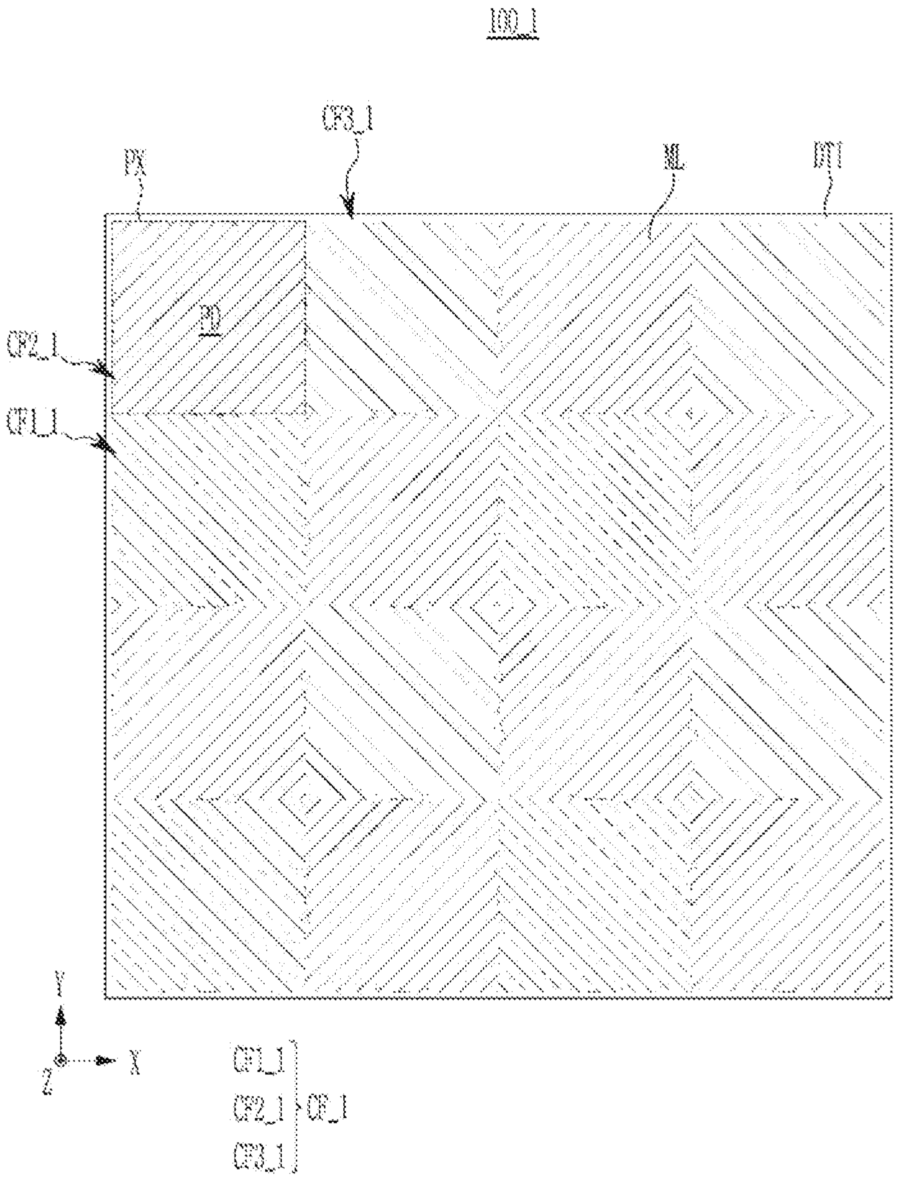
FIGS. 11 and 12 are plan views each showing an image sensor according to some embodiments of the present inventive concept.
Figure 12:
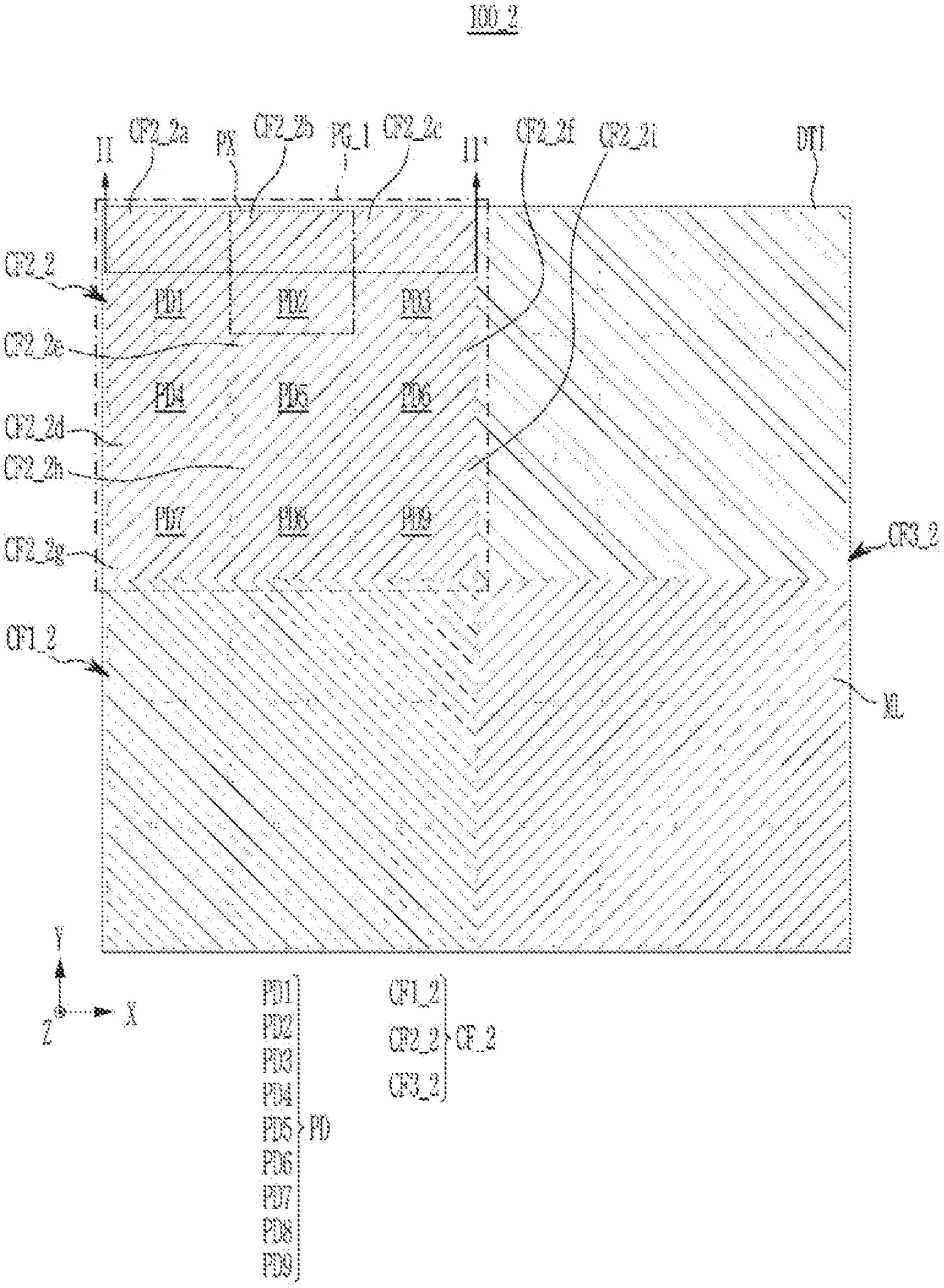

FIGS. 11 and 12 are plan views each showing an image sensor according to some embodiments of the present inventive concept. For example, FIGS. 11 and 12 are plan views showing a portion of each of image sensors 100_1 and 100_2 according to some embodiments of the present inventive concept.

The embodiment shown in FIG. 11 is different from an embodiment shown in FIG. 2 in an arrangement of the color filters CF corresponding to the pixels PX.

For example, in the image sensor 100_1 according to the embodiment shown in FIG. 11, a color filter CF_1 may be disposed corresponding to each of the plurality of pixels PX. For example, each color filter CF_1 may be disposed corresponding to each of the photodiodes PD.

Unlike the image sensor 100 according to an embodiment shown in FIG. 2, the color filters CF_1 according to this embodiment may have a Bayer pattern on a plane. For example, the color filters CF_1 may have a pattern in which the number of second color filters CF2_1 is about twice as large as the number of first color filters CF1_1 or third color filters CF3_1. For example, in the Bayer pattern, each color filter CF_1 arranged in the 2×2 array on a plane may include two second color filters CF2_1, which are disposed diagonally to each other, and the first color filter CF1_1 and the third color filter CF3_1, which are disposed diagonally to each other. Each first color filter CF1_1 and each third color filter CF3_1 may be disposed between the adjacent second color filters CF2_1. The color filters CF_1 of the Bayer pattern type may be repeatedly arranged in the first direction (or, e.g., the X direction) and the second direction (or, e.g., the Y direction).

In this embodiment, the first color filter CF1_1 may be a red color filter, the second color filter CF2_1 may be a green color filter, and the third color filter CF3_1 may be a blue color filter.

In addition, like an embodiment shown in FIG. 2, the micro lens ML may be disposed to correspond to the pixel PX. For example, one micro lens ML may be disposed on one pixel PX.

The embodiment shown in FIG. 12 is different from an embodiment shown in FIG. 2 with regard to a different arrangement of the pixels PX included in a pixel group PG_1 and a different arrangement of the color filters CF_2 corresponding to the pixel groups PG_1.

For example, referring to FIG. 12, each of the plurality of pixel groups PG_1 may include N×M pixels PX in the N×M array. For example, each number of N and M may be 3, and each of the pixel groups PG_1 may have a 3×3 Nona structure pixel array on a plane. For example, each of the plurality of pixel groups PG_1 may include the pixels PX arranged in the 3×3 array on a plane. However, this embodiment is not limited thereto, and the number of pixels PX included in one pixel group PG-1 may be variously modified. For example, each number of N and M may be 4, and each of the pixel groups PG_1 may have a 4×4 Hexadeca structure pixel array on a plane.

The photodiode PD may be disposed in each pixel PX that is included in each pixel group PG-1. For example, the photodiode PD that is disposed in the pixel group PG-1 may correspond to each pixel PX, and may include first to ninth photodiodes PD1, PD2, PD3, PD4, PD5, PD6, PD7, PD8, and PD9 that are adjacent to each other.

The color filters CF_2 may include a first color filter CF1_2, a second color filter CF2_2, and a third color filter CF3_2. For example, the first color filter CF1_1 may be the red color filter. The second color filter CF2_1 may be the green color filter, and the third color filter CF3_1 may be the blue color filter.

Like the pixel groups PG_1, the color filters CF_2 may include N×M sub-color filters in the N×M array. In this embodiment, each number of N and M may be 3, and the color filters CF_2 have the 3×3 Nona pattern on a plane.

For example, the second color filter CF2_2 may include a first sub-color filter CF2_2*a*, a second sub-color filter CF2_2*b*, a third sub-color filter CF2_2*c*, a fourth sub-color filter CF2_2*d*, a fifth sub-color filter CF2_2*e*, a sixth sub-color filter CF2_2*f*, a seventh sub-color filter CF2_2*g*, an eighth sub-color filter CF2_2*h*, and a ninth sub-color filter CF2_2*i*.

In addition, each of the first to ninth sub-color filters CF2_2*a*, CF2_2*b*, CF2_2*c*, CF2_2*d*, CF2_2*e*, CF2_2*f*, CF2_2*g*, CF2_2*h*, and CF2_2*i* may correspond to each of the first to ninth photodiodes PD1, PD2, PD3, PD4, PD5, PD6, PD7, PD8, and PD9.

However, the present inventive concept is not limited thereto, and the number of sub-color filters included in the color filter CF_2 may be variously modified. For example, each number of N and M may be 4, and the color filter CF_2 have the 4×4 Hexadeca pattern on a plane.

In addition, like an embodiment shown in FIG. 2, the micro lens ML may be disposed to correspond to the pixel PX. For example, one micro lens ML may be disposed on one pixel PX.

Figure 13:
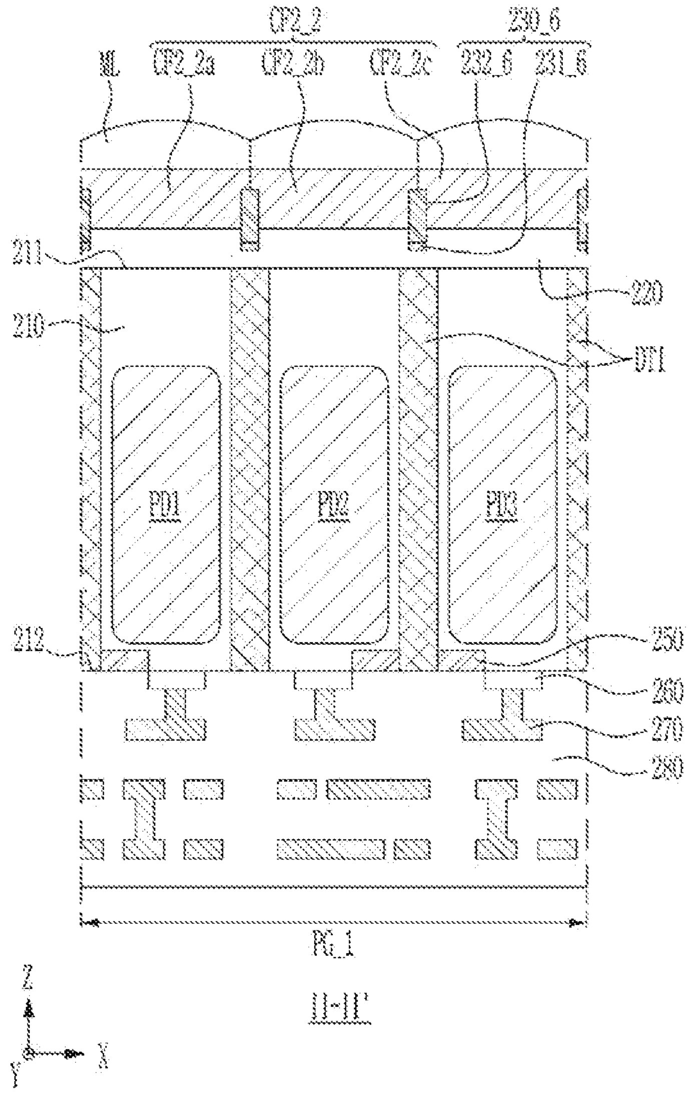
FIGS. 13, 14 and 15 are cross-sectional views each taken along line II-II' of FIG. 12 according to some embodiments of the present inventive concept.
Figure 14:
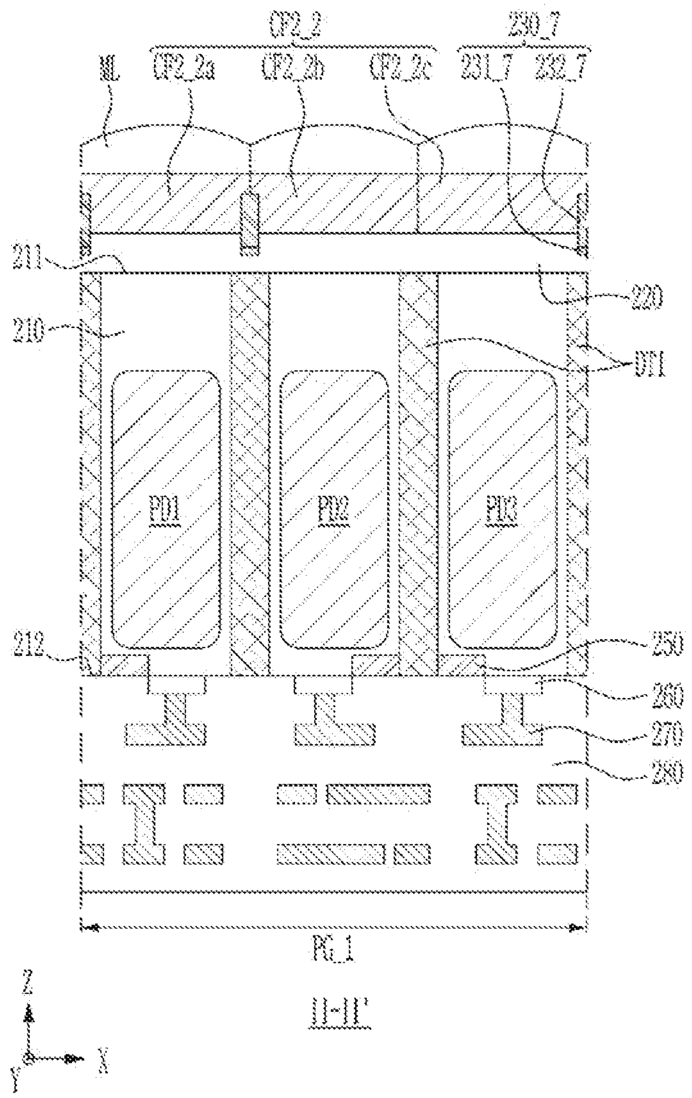
Figure 15:
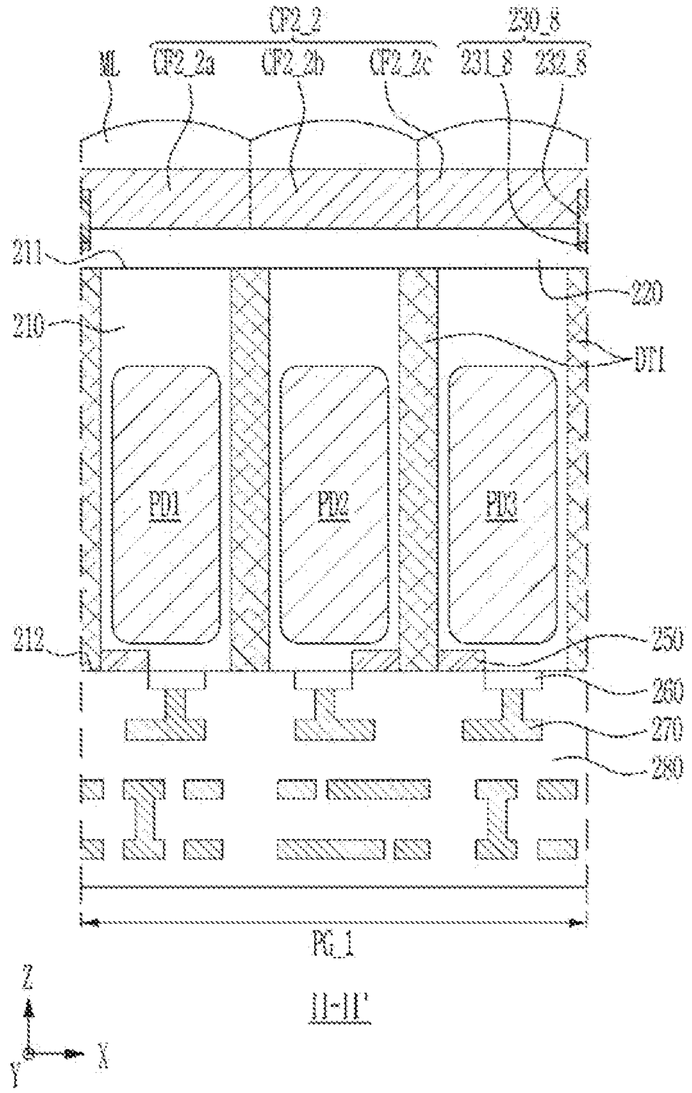

FIGS. 13 to 15 are cross-sectional views each taken along line II-II' of FIG. 12 according to some embodiments of the present inventive concept. For example, the embodiments according to FIGS. 13 to 15 are different from an embodiment shown in FIG. 3 regarding a different arrangement of fence patterns 230_6, 230_7, and 230_8.

According to the embodiments shown in FIGS. 12 and 13, the fence patterns 230_6 may be disposed on a boundary surface between different color filters CF_2 and on a boundary surface between sub-color filters of the same color filters CF2_2.

For example, the fence patterns 230_6 may be disposed on an edge of the second color filter CF2_2. That is, the fence patterns 230_6 may be disposed on a boundary surface between the first color filter CF1_2 and the second color filter CF2_2 and a boundary surface between the second color filter CF2_2 and the third color filter CF2_3.

In addition, the fence patterns 230_6 may be respectively disposed on a boundary surface between the first sub-color filter CF2_2*a* and the second sub-color filter CF2_2*b*, and a boundary surface between the second sub-color filter CF2_2*b* and the third sub-color filter CF2_2*c*, in the second color filter CF2_2.

According to the embodiment shown in FIG. 14, the fence patterns 230_7 may be disposed on any one of a boundary surface between the different color filters CF_2 and a boundary surface between the sub-color filters of the same color filters CF2_2.

For example, as in the embodiment shown in FIG. 13, the fence patterns 230_7 may be disposed on the edge of the second color filter CF2_2. For example, the fence patterns 230_7 may be disposed on the boundary surface between the first color filter CF1_2 and the second color filter CF2_2 and the boundary surface between the second color filter CF2_2 and the third color filter CF3_2.

However, unlike the embodiment shown in FIG. 13, the fence patterns 230_7 according to the embodiment shown in FIG. 14 may be disposed on only one of the boundary surface between the first sub-color filter CF2_2*a* and the second sub-color filter CF2_2*b*, and the boundary surface between the second sub-color filter CF2_2*b* and the third sub-color filter CF2_2*c*, in the second color filter CF2_2. For example, as shown in FIG. 14, the fence patterns 230_7 may be disposed only on the boundary surface between the first sub-color filter CF2_2*a* and the second sub-color filter CF2_2*b*, in the second color filter CF2_2. For example, the fence patterns 230_7 may be disposed only on the boundary surface between the second sub-color filter CF2_2*b* and the third sub-color filter CF2_2*c*, in the second color filter CF2_2.

According to the embodiment shown in FIG. 15, the fence patterns 230_8 may be disposed only on the boundary surface between the different color filters CF_2.

For example, like the embodiment shown in FIG. 13, the fence patterns 230_8 may be disposed on the edge of the second color filter CF2_2. For example, the fence patterns 230_8 may be disposed on the boundary surface between the first color filter CF1_2 and the second color filter CF2_2 and the boundary surface between the second color filter CF2_2 and the third color filter CF3_2.

However, unlike the embodiment shown in FIG. 13, the fence patterns 230_8 according to the embodiment shown in FIG. 15 might not be disposed on the boundary surface between the first sub-color filter CF2_2*a* and the second sub-color filter CF2_2*b*, and the boundary surface between the second sub-color filter CF2_2*b* and the third sub-color filter CF2_2*c*, in the second color filter CF2_2.

According to the image sensor according to the embodiments shown in FIGS. 13 to 15, the fence patterns 230_6, 230_7, and 230_8 may be disposed on at least one of the boundary surface between the different color filters CF_2 and the boundary surface between the sub-color filters in each of the same color filters CF_2, or disposed only on the boundary surface between the different color filters CF_2. In this case, the fence patterns 230_6, 230_7, and 230_8 may extend from the color filter CF_2 to the anti-reflection layer 220 that is disposed under the color filter CF_2, thereby suppressing the crosstalk between the adjacent pixels PX by preventing light incident to the pixels PX from passing through the boundary surface of the different color filters CF_2 and/or the boundary surface of the sub-color filters.

Figure 16:
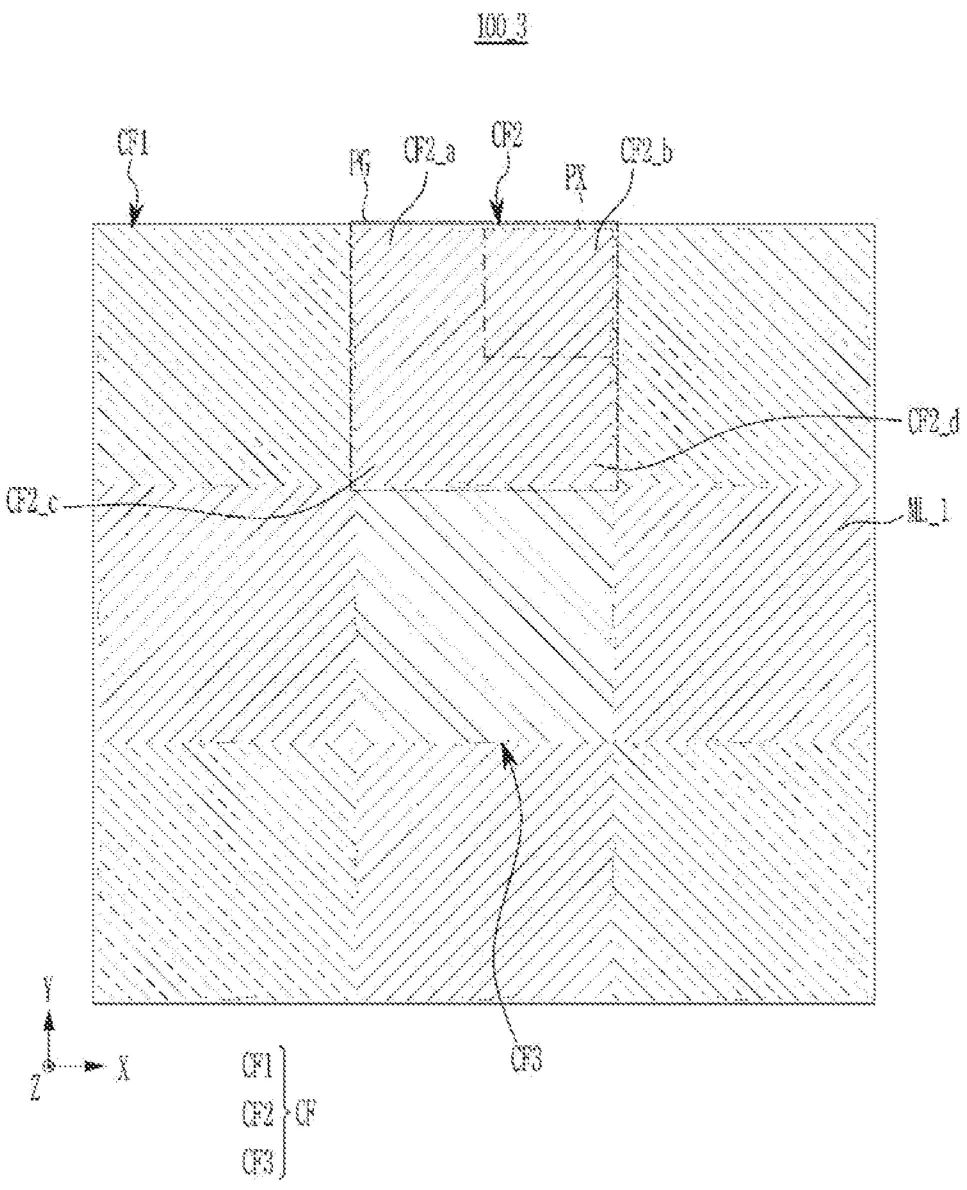
FIGS. 16 and 17 are plan views each showing an image sensor according to some embodiments of the present inventive concept.
Figure 17:
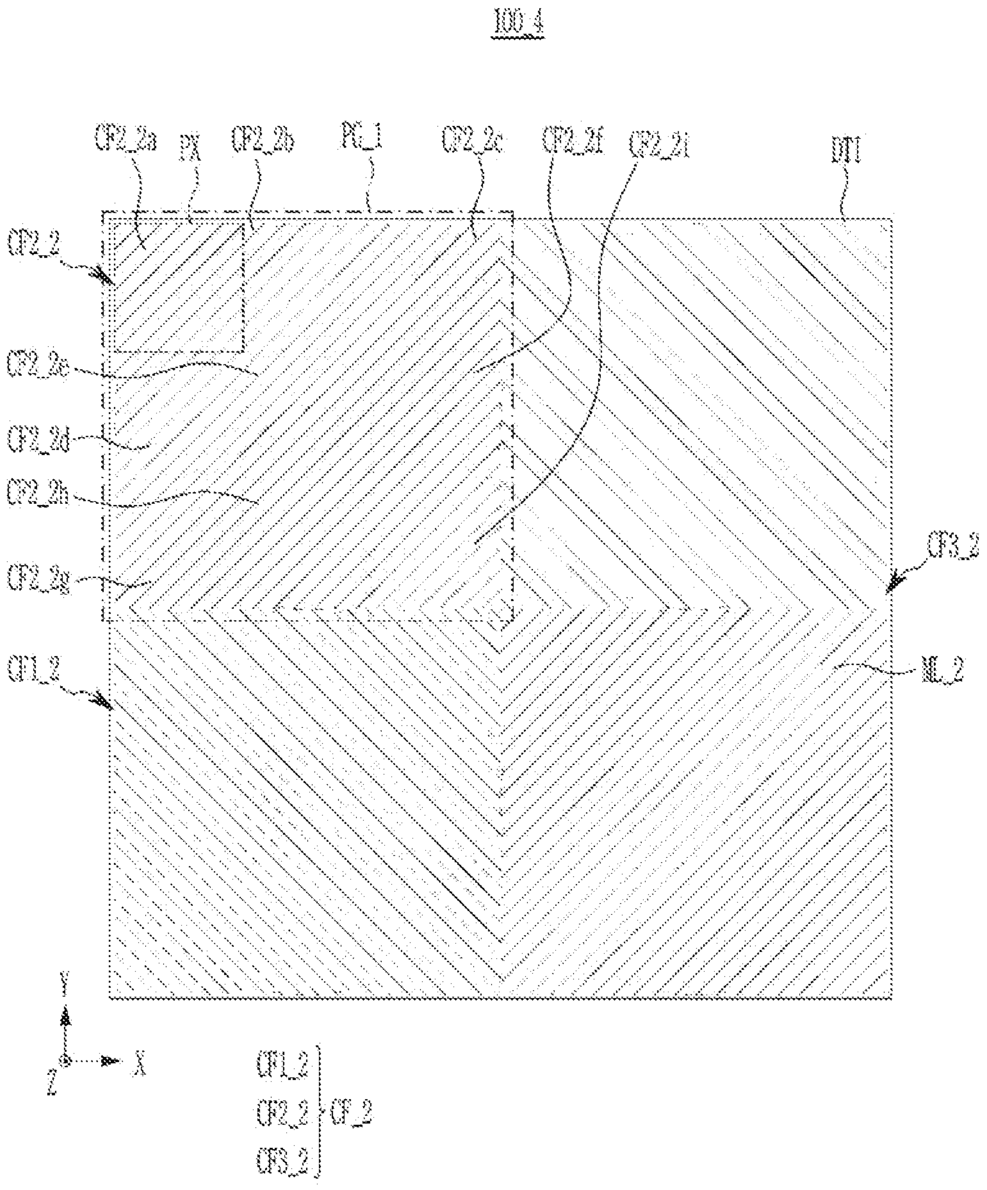

FIGS. 16 and 17 are plan views each showing an image sensor according to some embodiments of the present inventive concept.

The embodiment shown in FIG. 16 is different from an embodiment shown in FIG. 2 in that a different arrangement of the micro lenses ML_1 is provided.

For example, the micro lens ML_1 may be disposed to correspond to the pixel group PG. For example, one micro lens ML_1 may be disposed on each of the 2×2 pixels PX of the pixel group PG. For example, in one pixel group PG, a 1:1 ratio may be a ratio between the number of color filters CF and the number of micro lenses ML. For example, one micro lens ML_1 may be shared by the first sub-color filter CF2_*a*, the second sub-color filter CF2_*b*, the third sub-color filter CF2_*c*, and the fourth sub-color filter CF2_*d*, which are included in the second color filter CF2.

The embodiment shown in FIG. 17 is different from the embodiment shown in FIG. 12 in that a different arrangement of the micro lenses ML_2 is provided.

For example, the micro lenses ML_2 may be disposed to correspond to the pixel group PG_1. For example, one micro lens ML_2 may be disposed on each of the 3×3 pixels PX of the pixel group PG_1. For example, in one pixel group PG_1, a 1:1 ratio may be a ratio between the number of color filters CF_2 and the number of micro lenses ML_2. For example, one micro lens ML_2 may be shared by the first sub-color filter CF2_2*a*, the second sub-color filter CF2_2*b*, the third sub-color filter CF2_2*c*, the fourth sub-color filter CF2_2*d*, the fifth sub-color filter CF2_2*e*, the sixth sub-color filter CF2_2*f*, the seventh sub-color filter CF2_2*g*, the eighth sub-color filter CF2_2*h*, and the ninth sub-color filter CF2_2, which are included in the second color filter CF2_2. However, the present inventive concept is not limited thereto, and in some embodiments of the present inventive concept, one micro lens ML_2 may be disposed on each of the 4×4 pixels PX of the pixel group PG_1.

Hereinafter, the description describes a method of manufacturing an image sensor with reference to FIGS. 18 to 26. In the following examples, the same reference numerals refer to the same component as in an embodiment described above. In addition, redundant descriptions thereof are omitted or simplified, and their differences are mainly described.

FIGS. 18 to 26 are schematic cross-sectional views illustrating the method of manufacturing an image sensor according to an embodiment of the present inventive concept. In detail, FIGS. 18 to 26 may be cross-sectional view sequentially showing respective steps of a manufacturing process of an image sensor 100 according to an embodiment of the present inventive concept.

Figure 18:
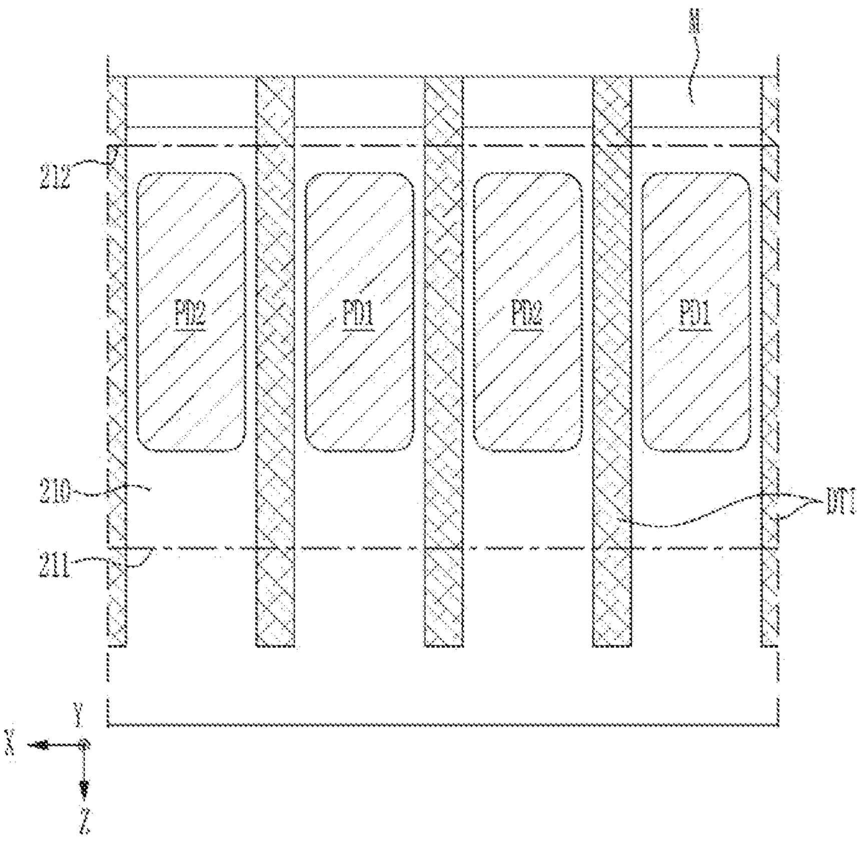
FIGS. 18, 19, 20, 21, 22, 23, 24, 25 and 26 are schematic cross-sectional views illustrating a method of manufacturing an image sensor according to an embodiment of the present inventive concept.

Referring to FIG. 18, first and second photodiodes PD1 and PD2 doped with a second conductive impurity different from a first conductive impurity may be formed in a substrate 210 by performing an ion implantation process in the substrate 210 doped with the first conductive impurity. For example, the first conductive impurity may be a P-type conductive impurity, and the second conductive impurity may be an N-type conductive impurity.

The substrate 210 may be made of, for example, silicon-on-insulator (SOI). In addition, the substrate 210 may have an epitaxial layer formed on a base substrate.

Next, a mask pattern M including an open portion may be formed on one surface of the substrate 210. A trench may be formed by etching the substrate 210 by using the mask pattern M. A portion of the substrate 210 that corresponds to the open portion of the mask pattern M may be etched, and a portion of the substrate 210 that is covered by the mask pattern M might not be etched.

Next, an insulating material may fill the inside of the trench to form an element isolation film DTI. As shown in FIG. 18, the trench for forming the element isolation film DTI may be formed not to pass through the substrate 210. For example, the trench may be formed by etching only a portion of a total thickness of the entire substrate 210. A depth of the trench may be less than the thickness of the substrate 210.

The trench for forming the element isolation film DTI may be formed from an upper or lower surface of the substrate 210. When formed from the upper surface of the substrate 210, the trench and the element isolation film DTI may be formed before a pixel circuit described below is formed. When formed from the lower surface of the substrate 210, the trench and the element isolation film DTI may be formed after the pixel is formed. Hereinafter, the description describes a case where the trench is formed from the upper surface of the substrate 210.

The mask pattern M may be removed by a polishing process along with portions of the substrate 210 and the element isolation film DTI. The upper surface of the substrate 210 that remains after being removed by the polishing process may be defined as a second surface 212.

Figure 19:
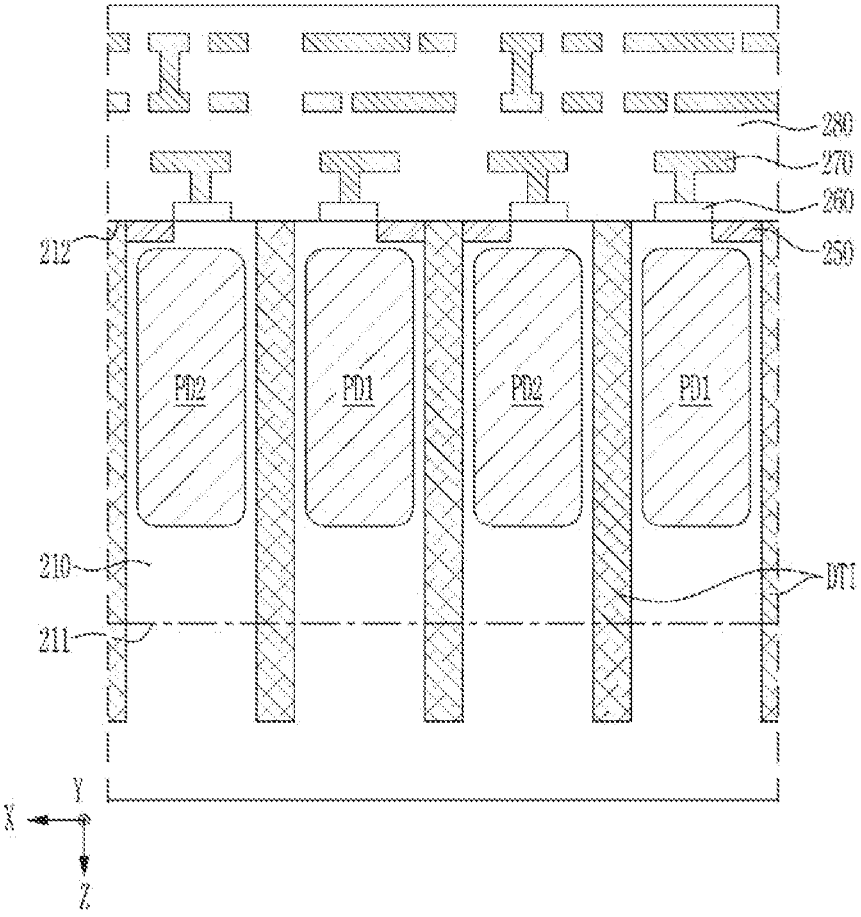

Next, referring to FIG. 19, the pixel circuit may be formed on the second surface 212 remaining after the polishing process is performed. As described above, the pixel circuit may include a plurality of elements 260, wiring patterns 270 connected to the plurality of elements 260, and an insulating layer 280 covering the plurality of elements 260 and the wiring patterns 270.

Portions of the substrate 210 and the element isolation film DTI, which is on an opposite side of the second surface 212 of the substrate 210, may be removed from by the polishing process. The lower surface of the substrate 210 that remains after being removed by the polishing process may be defined as a first surface 211.

Accordingly, the element isolation film DTI may pass through the substrate 210 to be connected to the first surface 211 and the second surface 212. For example, the element isolation film DTI may extend in a third direction (or, e.g., the Z direction). For example, an upper surface of the element isolation film DTI may be connected to the first surface 211, and a lower surface of the element isolation film DTI may be connected to the second surface 212.

Figure 20:
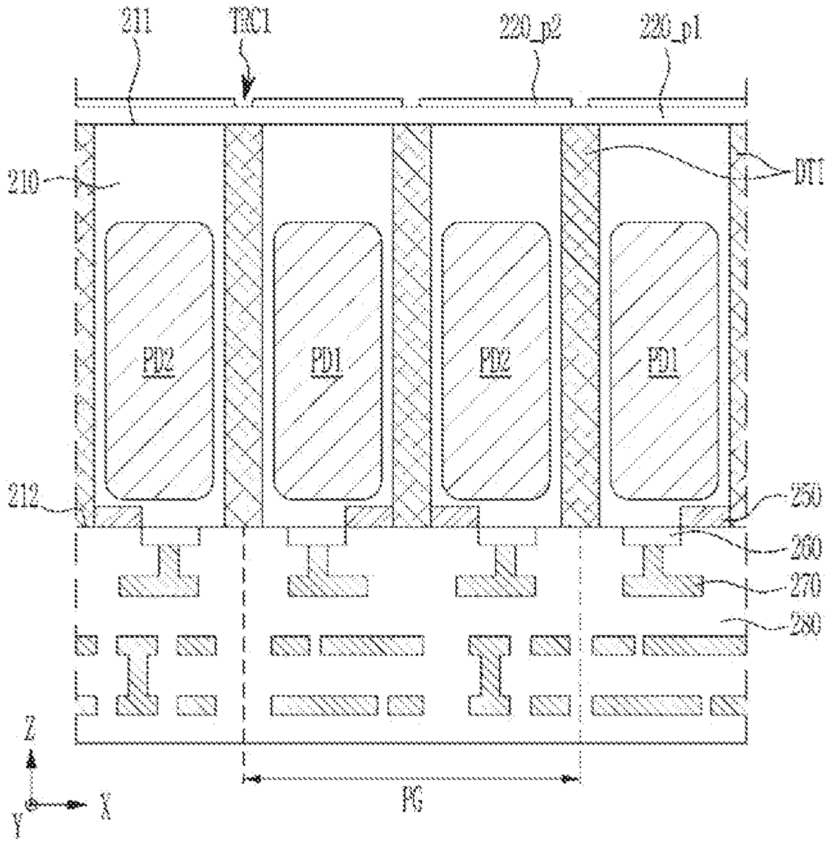
Figure 21:
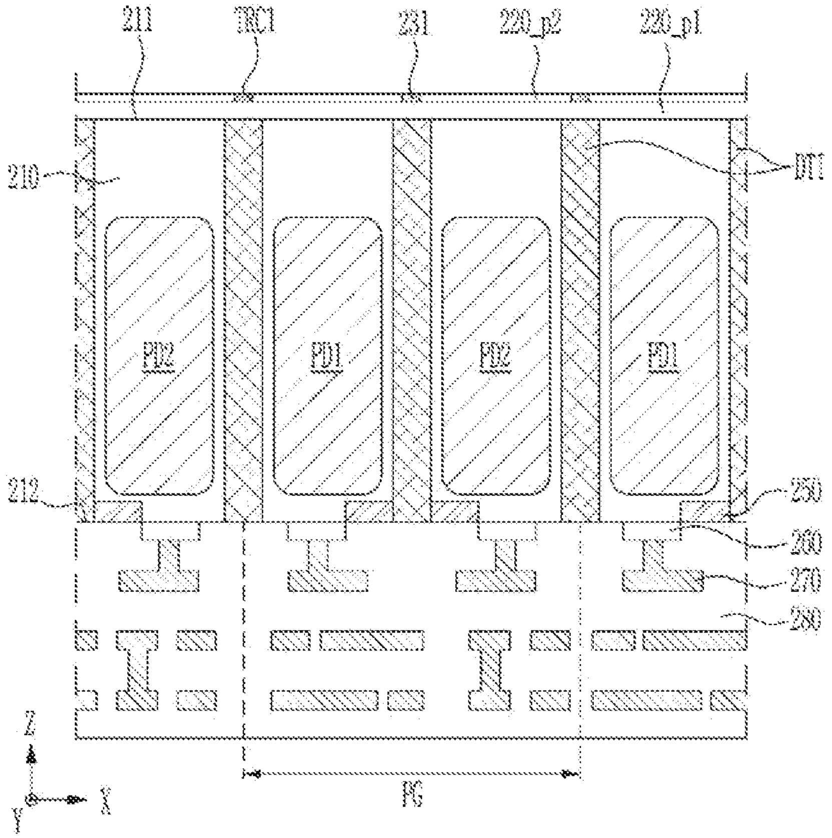

Next, referring to FIGS. 20 and 21, a first preliminary anti-reflection layer 220_*p*1 and a second preliminary anti-reflection layer 220_*p*2 may be sequentially formed on the first surface 211 of the substrate 210. For example, the first preliminary anti-reflection layer 220_*p*1 may be formed on the first surface 211 of the substrate 210, and the second preliminary anti-reflection layer 220_*p*2 may be formed on the first preliminary anti-reflection layer 220_*p*1.

The first preliminary anti-reflection layer 220_*p*1 may include, for example, metal oxide or metal fluoride, including at least one of, for example, hafnium (Hf), zirconium (Zr), aluminum (Al), tantalum (Ta), titanium (Ti), and/or yttrium (Y). For example, the second preliminary anti-reflection layer 220_*p*2 may include silicon oxide or silicon nitride.

Next, a first trench TRC1 may be formed in the second preliminary anti-reflection layer 220_*p*2 by patterning the second preliminary anti-reflection layer 220_*p*2 by using photo and etching processes. For example, the first trench TRC1 may be formed for an upper surface of the first preliminary anti-reflection layer 220_*p*1 to be exposed from a region of the second preliminary anti-reflection layer 220_*p*2 that overlaps the element isolation film DTI in the third direction (or, e.g., the Z direction).

The mask pattern may be formed on the second preliminary anti-reflection layer 220_*p*2, and the second preliminary anti-reflection layer 220_*p*2 may be patterned by using the mask pattern. The mask pattern may be, for example, a photoresist pattern or a material having an etching selectivity with the second preliminary anti-reflection layer 220_*p*2. The upper surface of the first preliminary anti-reflection layer 220_*p*1 may be exposed by etching the second preliminary anti-reflection layer 220_*p*2 by using the mask pattern as an etch mask.

Next, a first layer 231 of a fence pattern 230 to be described below may be formed in each first trench TRC1 by using a conductive material.

The conductive material may include, for example, at least one of titanium (Ti), titanium nitride (TiN), tungsten (W), aluminum (Al), and copper (Cu). However, the present inventive concept is not limited thereto, and the conductive material may be variously modified.

An upper surface of the second preliminary anti-reflection layer 220_*p*2 may be exposed by forming the conductive material on the upper surface of the second preliminary anti-reflection layer 220_*p*2 and the first trenches TRC1, and patterning the conductive material.

Next, the first layer 231 of the fence pattern 230 to be described below may be formed in the first trench TRC1 by removing a portion of the conductive material protruding beyond the upper surface of the second preliminary anti-reflection layer 220_*p*2 in the first trench TRC1 by the polishing process. However, the present inventive concept is not limited thereto, and the polishing process may be omitted in some embodiments of the present inventive concept. In addition, the first layer 231 of the fence pattern 230 may be formed in the first trench TRC1 by forming the conductive material in the upper surface of the second preliminary anti-reflection layer 220_*p*2 and the first trench TRC1, and then performing the polishing process.

In addition, to form a first layer 231_4 of a fence pattern 230_4 according to the embodiment shown in FIG. 8, the conductive material may be conformally formed along the upper surface of the second preliminary anti-reflection layer 220_*p*2 and the inner surface of the first trench TRC1, and the conductive material may then be patterned.

Figure 22:
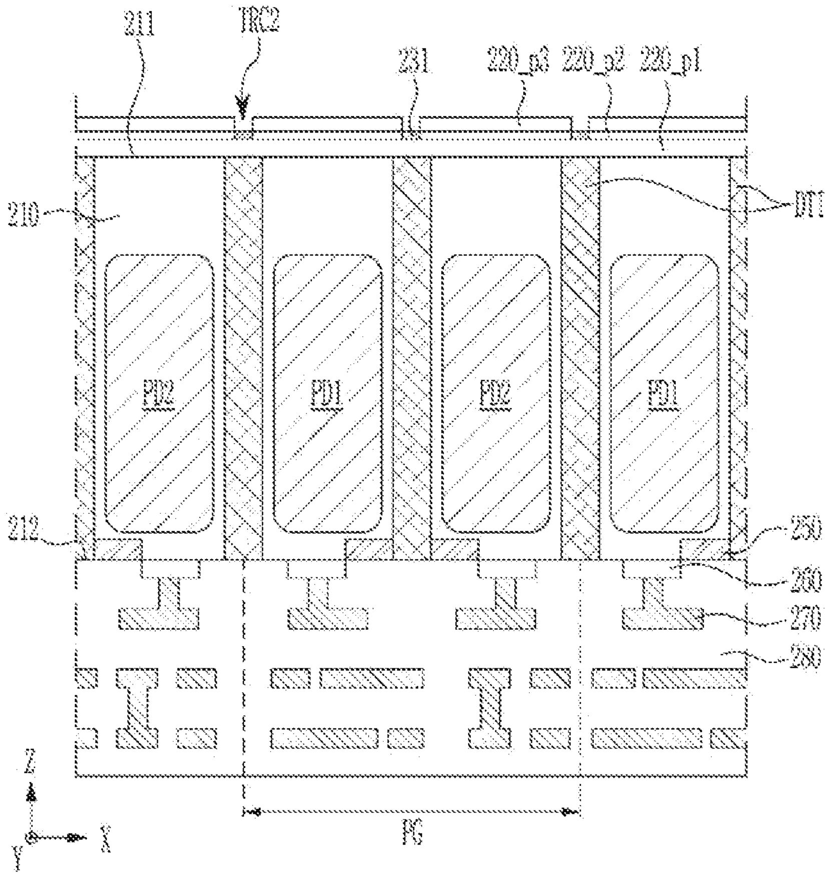

Next, referring to FIG. 22, a third preliminary anti-reflection layer 220_*p*3 may be formed on the second preliminary anti-reflection layer 220_*p*2.

The third preliminary anti-reflection layer 220_*p*3 may include a material different from that of the second preliminary anti-reflection layer 220_*p*2, and include the same material as that of the first preliminary anti-reflection layer 220_*p*1. However, the present inventive concept is not limited thereto, and the material of the third preliminary anti-reflection layer 220_*p*3 may be variously modified.

Next, the third preliminary anti-reflection layer 220_*p*3 may be patterned through the mask pattern to form a second trench TRC2. For example, the second trench TRC2 may be formed in the third preliminary anti-reflection layer 220_*p*3 to expose an upper surface of the first layer 231 of the fence pattern 230 to be described below. The second trench TRC2 may be formed using the mask pattern by the same method as the aforementioned method of forming the first trench TRC1. However, the present inventive concept is not limited thereto, and the method of forming the second trench TRC2 may be variously modified.

Figure 23:
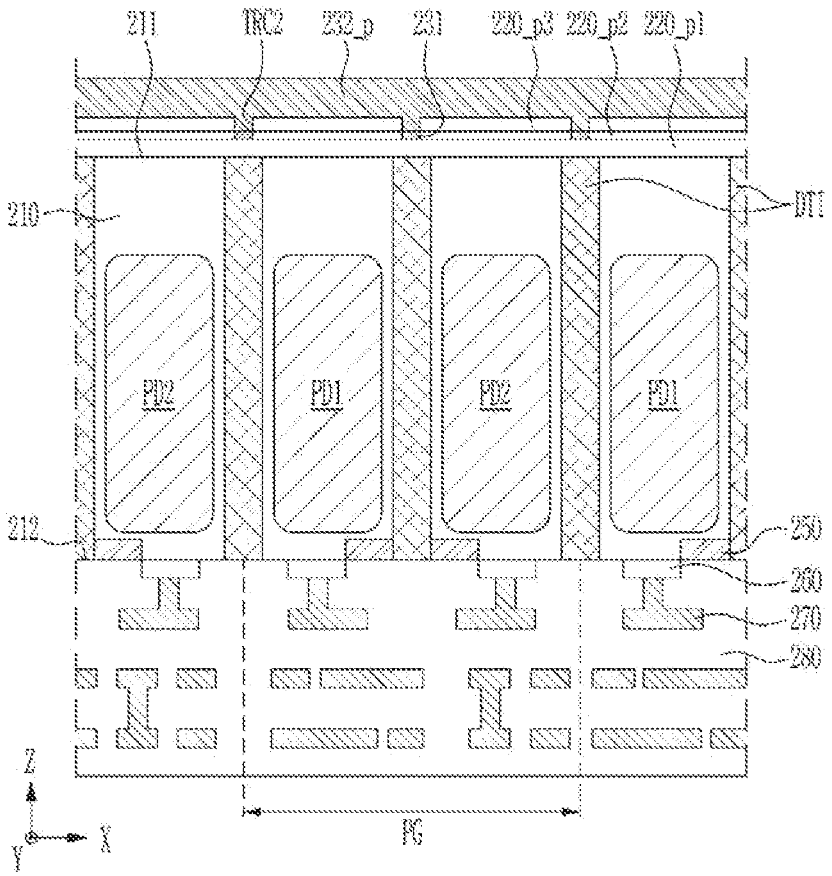
Figure 24:
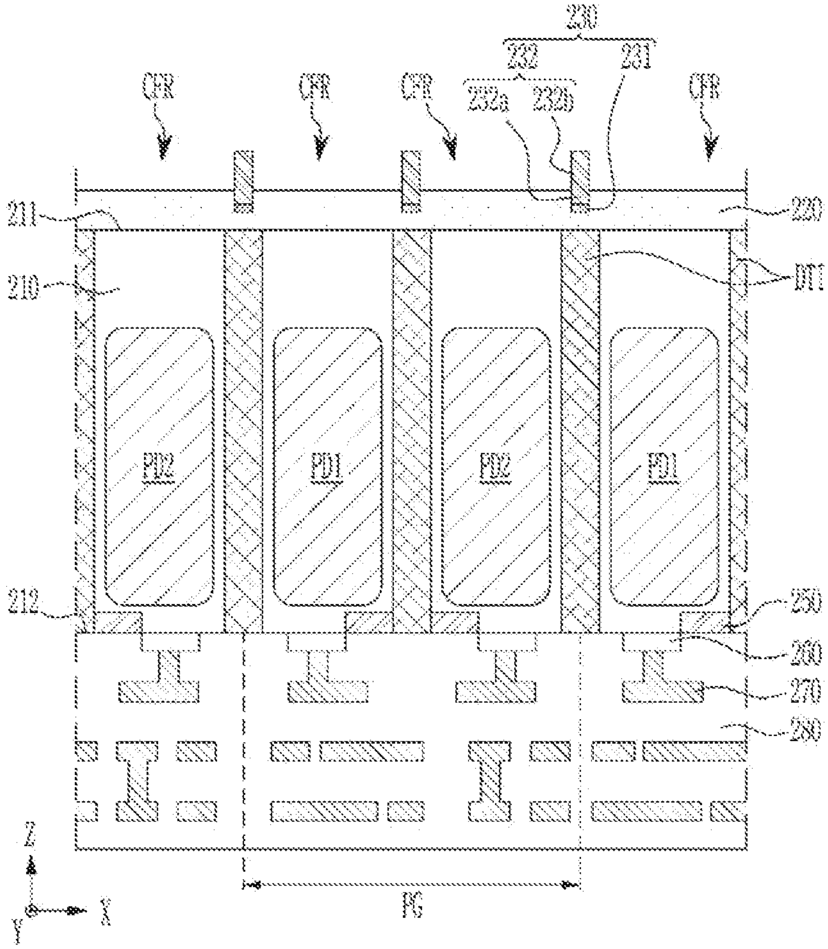

Next, referring to FIG. 23 and FIG. 24, an insulating material may be formed on an upper surface of the third preliminary anti-reflection layer 220_*p*3 and in the second trench TRC2. The insulating material may then be patterned to expose the upper surface of the third preliminary anti-reflection layer 220_*p*3, and to allow the insulating material in the second trench TRC2 to protrude beyond the upper surface of the third preliminary anti-reflection layer 220_*p*3.

The insulating material may include a material different from that of the third preliminary anti-reflection layer 220_*p*3, and thus have an etching selectivity with respect to the third preliminary anti-reflection layer 220_*p*3. For example, the insulating material may include, for example, oxide or nitride including silicon (Si), aluminum (Al), or a combination thereof. However, the present inventive concept is not limited thereto, and the insulating material may be variously modified.

The insulating material may be patterned in the following way. For example, the first layer 231 of the fence pattern 230 and a first part 232*a* of a second layer 232 may thus be disposed in an anti-reflection layer 220, and the fence pattern 230 may be formed for a second part 232*b* of the second layer 232 to be exposed by protruding beyond an upper surface of the anti-reflection layer 220. In addition, the fence patterns 230 protruding beyond the upper surface of the anti-reflection layer 220 may define color filter regions CFR.

Figure 25:
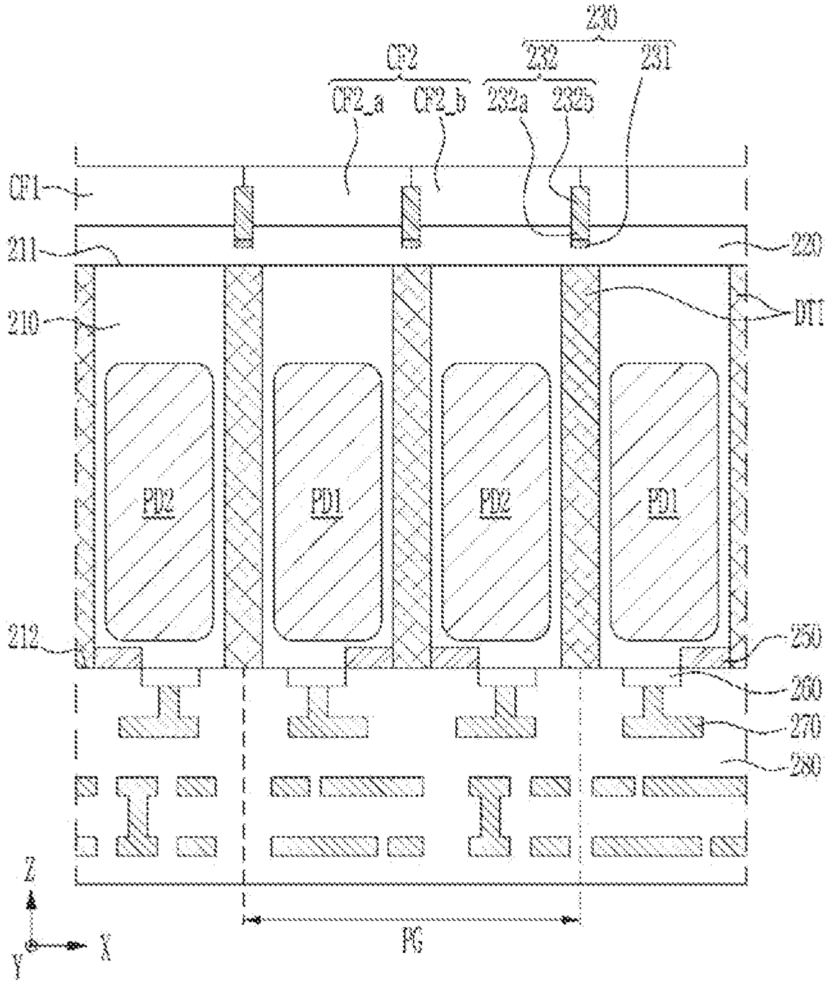
Figure 26:
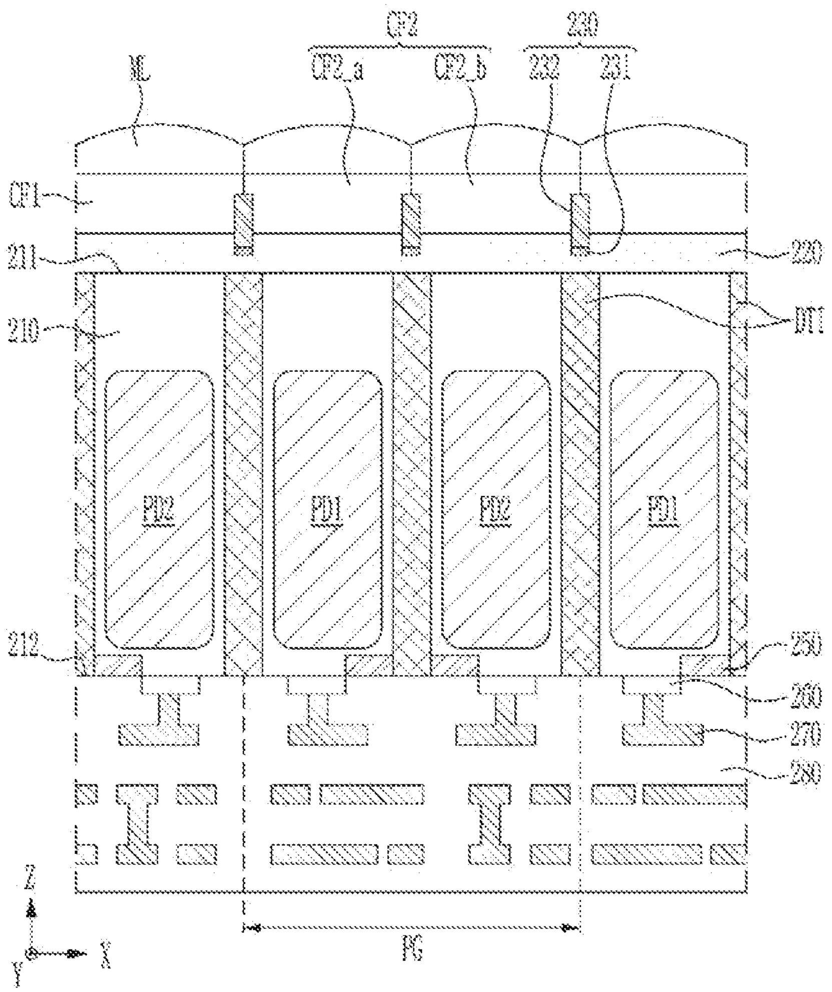

Next, referring to FIGS. 25 and 26, color filters CF1 and CF2 may respectively be formed in the color filter regions CFR. The color filters CF1 and CF2 may be formed by performing a photolithography process a plurality of times. For example, the photolithography process may include a coating process of a photoresist composition including dye/pigment, a soft bake process, an exposure process, a post bake process, and a development process. However, the present inventive concept is not limited thereto, and the process of forming the color filters CF1 and CF2 may be modified in various ways.

Accordingly, the fence patterns 230 may respectively be disposed on a boundary surface between the color filters CF1 and CF2 and on a boundary surface between sub-color filters CF2_*a* and CF2_*b* in the color filters CF1 and CF2. For example, the fence patterns 230 may be disposed on the boundary surface between the first color filter CF1 and the second color filter CF2 and the boundary surface between the first sub-color filter CF2_*a* and the second sub-color filter CF2_*b*, in the second color filter CF2.

In addition, the color filters CF1 and CF2 may be formed in the color filter regions CFR, and the second part 232*b* of the second layer 232 of the fence pattern 230 may then be exposed by protruding beyond the upper surface of the anti-reflection layer 220 and may be disposed in the color filter CF1 or CF2.

Next, micro lenses ML for collecting light incident from the outside may be formed on upper surfaces of the color filters CF1 and CF2. The micro lenses ML formed on the color filters CF1 and CF2 may complete the image sensor 100 shown in FIG. 26 through the etching process.

The manufacturing process of the image sensor 100 described above with reference to FIGS. 18 to 26 is an embodiment of the present inventive concept, and the present inventive concept is not limited thereto. In some embodiments of the present inventive concept, the aforementioned manufacturing process may omit some steps or further include another manufacturing process step.

While the present inventive concept has been shown and described with reference to the embodiments thereof, it will be apparent to those of ordinary skill in the art that various changes in form and detail may be made thereto without departing from the spirit and scope of the present inventive concept.

What is claimed is:

1. An image sensor comprising:
a substrate;
a plurality of photodiodes disposed in the substrate;
an element isolation film disposed between the plurality of photodiodes;
an anti-reflection layer disposed on the plurality of photodiodes and the element isolation film;
a plurality of color filters disposed on the anti-reflection layer;
a fence pattern disposed between the plurality of color filters and in the anti-reflection layer; and
micro lenses disposed on the plurality of color filters,
wherein the fence pattern includes a first layer and a second layer that is disposed on the first layer and that includes a material different from that of the first layer,
the first layer is disposed in the anti-reflection layer,
the second layer includes a first part and a second part, wherein the first part is disposed in the plurality of color filters, and wherein the second part is disposed in the anti-reflection layer, and
an upper surface of the first layer facing the second part and a lower surface of the second part facing the first layer are disposed below a level of the plurality of color filters with respect to the plurality of photodiodes.

2. The image sensor of claim 1, wherein
the first layer includes a first material that is a conductive material, and
the second layer includes a second material having a refractive index that is lower than those of the plurality of color filters and the anti-reflection layer.

3. The image sensor of claim 2, wherein
the first material includes at least one of tungsten (W), titanium nitride (TiN), or titanium (Ti), and
the second material includes at least one of silicon oxide or silicon nitride.

4. The image sensor of claim 1, wherein
the fence pattern includes a side surface that is inclined with respect to an upper surface of the substrate.

5. The image sensor of claim 1, wherein
a side surface of the fence pattern includes a curved surface.

6. The image sensor of claim 1, wherein
the first layer of the fence pattern at least partially surrounds the lower surface and a portion of a side surface of the second part of the second layer.

7. The image sensor of claim 1, wherein
the first layer has a first thickness,
the first part of the second layer has a second thickness,
the second part of the second layer has a third thickness, and
the first thickness is less than the third thickness.

8. The image sensor of claim 7, wherein
a sum of the first thickness and the third thickness is smaller than the second thickness.

9. The image sensor of claim 8, wherein
the second thickness is greater than the third thickness.

10. The image sensor of claim 7, wherein
a sum of the first thickness and the third thickness is smaller than a thickness of the anti-reflection layer.

11. The image sensor of claim 7, wherein
a thickness of the fence pattern is greater than a width of the fence pattern.

12. The image sensor of claim 1, wherein
the plurality of color filters include a first color filter and a second color filter having different colors from each other, and
the fence pattern is disposed on a boundary surface between the first color filter and the second color filter.

13. The image sensor of claim 12, wherein
the first color filter includes a plurality of first sub-color filters respectively overlapping the plurality of photodiodes,
the second color filter includes a plurality of second sub-color filters respectively overlapping the plurality of photodiodes, and
the fence pattern is disposed on at least one of a boundary surface between the plurality of first sub-color filters or a boundary surface between the plurality of second sub-color filters.

14. An image sensor comprising:
a substrate having a pixel group including a plurality of pixels;

a plurality of photodiodes disposed in the substrate and respectively corresponding to the plurality of pixels;

an element isolation film disposed between the plurality of photodiodes;

an anti-reflection layer disposed on the plurality of photodiodes and the element isolation film;

a plurality of color filters disposed on the anti-reflection layer;

a fence pattern disposed between the plurality of color filters and in the anti-reflection layer; and micro lenses disposed on the plurality of color filters, wherein the fence pattern includes a first part, a second part, and a third part, the first part is disposed in the plurality of color filters, the second part is disposed in the anti-reflection layer, the third part is disposed in the anti-reflection layer and is disposed between the first part and the second part, the second part is disposed between upper and lower surfaces of the anti-reflection layer, the first part and the third part include a same material as each other, the second part includes a material different from those of the first part and the third part, and an upper surface of the second part facing the third part and a lower surface of the third part facing the second part are disposed below a level of the plurality of color filters with respect to the plurality of photodiodes.

15. The image sensor of claim 14, wherein a lower surface of the second part is spaced apart from the element isolation film.

16. The image sensor of claim 14, wherein a width of the fence pattern is smaller than a width of the element isolation film, and, a lower surface of the second part is disposed on an upper surface of the element isolation film.

17. The image sensor of claim 14, wherein a thickness of the second part is smaller than a thickness of the third part, and a sum of the thickness of the second part and the thickness of the third part is smaller than a thickness of the anti-reflection layer.

18. The image sensor of claim 14, wherein an upper surface of the third part is disposed at a substantially same level as the upper surface of the anti-reflection layer, and the lower surface of the third part is disposed at a substantially same level as the upper surface of the second part.

19. A method of manufacturing an image sensor, the method comprising:

forming a plurality of photodiodes in a substrate;

forming an element isolation film between the plurality of photodiodes;

forming a first anti-reflection layer on the plurality of photodiodes and the element isolation film;

forming a second anti-reflection layer on the first anti-reflection layer;

forming a first trench by patterning the second anti-reflection layer;

forming a first layer of a fence pattern by providing a conductive material in the first trench;

forming a third anti-reflection layer on the second anti-reflection layer;

forming a second trench exposing the first layer by patterning the third anti-reflection layer; and forming a second layer of the fence pattern in the second trench, wherein the second layer protrudes beyond an upper surface of the third anti-reflection layer, and the second layer of the fence pattern includes a material different from those of the first layer and the third anti-reflection layer.

20. The method of claim 19, wherein the forming of the second layer of the fence pattern in the second trench to protrude beyond the upper surface of the third anti-reflection layer includes:

forming an insulating material layer on the first layer and the third anti-reflection layer; and patterning the insulating material layer, and the third anti-reflection layer has an etching selectivity with respect to the insulating material layer.

* * * * *